(12) United States Patent
Morinaka et al.

(10) Patent No.: US 9,903,986 B2
(45) Date of Patent: Feb. 27, 2018

(54) LIGHT EXTRACTION FILM FOR EL ELEMENTS, SURFACE LIGHT EMITTING BODY, AND METHOD FOR PRODUCING LIGHT EXTRACTION FILM FOR EL ELEMENTS

(71) Applicant: Mitsubishi Rayon Co., Ltd., Tokyo (JP)

(72) Inventors: Takeshi Morinaka, Yokohama (JP); Kazunori Mukunoki, Yokohama (JP); Toshiaki Hattori, Yokohama (JP); Yusuke Kurita, Yokohama (JP); Naoko Yamada, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 14/408,720

(22) PCT Filed: Jul. 12, 2013

(86) PCT No.: PCT/JP2013/069174
§ 371 (c)(1),
(2) Date: Dec. 17, 2014

(87) PCT Pub. No.: WO2014/021088
PCT Pub. Date: Feb. 6, 2014

(65) Prior Publication Data
US 2015/0177427 A1    Jun. 25, 2015

(30) Foreign Application Priority Data

Jul. 31, 2012   (JP) ................................. 2012-169546

(51) Int. Cl.
*G02B 5/02* (2006.01)
*H01L 51/52* (2006.01)
(Continued)

(52) U.S. Cl.
CPC ......... *G02B 5/0242* (2013.01); *G02B 3/0056* (2013.01); *G02B 5/0215* (2013.01);
(Continued)

(58) Field of Classification Search
CPC .... G02B 5/0215; G02B 5/0242; G02B 6/003; G02B 6/0025; G02B 6/0036; G02B 6/004;
(Continued)

(56) References Cited

U.S. PATENT DOCUMENTS

2007/0121227 A1* 5/2007 Wang ................... G02B 5/0231
359/831
2008/0138579 A1* 6/2008 Hsu .................... B29D 11/0074
428/148
(Continued)

FOREIGN PATENT DOCUMENTS

EP        2224788 A1      9/2010
JP      2004-004777 A     1/2004
(Continued)

OTHER PUBLICATIONS

International Search Report issued in corresponding International Patent Application No. PCT/JP2013/069174 dated Oct. 22, 2013.
(Continued)

*Primary Examiner* — Jong-Suk (James) Lee
*Assistant Examiner* — Zheng Song
(74) *Attorney, Agent, or Firm* — Morgan, Lewis & Bockius LLP

(57) ABSTRACT

A light extraction film for EL elements enables a surface light emitting body to have a good balance between suppression of emission angle dependence of the wavelength of emitted light and improvement of light extraction efficiency and luminance in the normal direction. A surface light emitting body has improved light extraction efficiency and
(Continued)

luminance in the normal direction, while being suppressed in emission angle dependence of the wavelength of emitted light. A light extraction film for EL elements comprises a recessed and projected structure having a plurality of spherical projections, each containing a resin and fine particles added into the resin. The content of the fine particles in the spherical projections is 22-55% by mass, and the average maximum diameter ($A_{ave}$) of the bottom portions of the spherical projections and the volume average particle diameter (P) of the fine particles satisfy the following mathematical formula (1).

$$A_{ave}/P \geq 5 \qquad (1)$$

14 Claims, 4 Drawing Sheets

(51) Int. Cl.
*G02B 3/00* (2006.01)
*F21V 8/00* (2006.01)

(52) U.S. Cl.
CPC ......... *G02B 5/0268* (2013.01); *G02B 5/0278* (2013.01); *H01L 51/5268* (2013.01); *H01L 51/5275* (2013.01); *G02B 6/004* (2013.01); *G02B 6/0043* (2013.01); *G02B 6/0051* (2013.01); *G02B 6/0053* (2013.01)

(58) Field of Classification Search
CPC ... G02B 6/0043; G02B 6/0051; G02B 6/0053
USPC ...... 362/97.1, 97.4, 606, 607, 618; 313/463, 313/483–512
See application file for complete search history.

(56) References Cited

U.S. PATENT DOCUMENTS

| 2008/0225207 | A1* | 9/2008 | Kim | G02B 3/005 349/95 |
| 2008/0310171 | A1* | 12/2008 | Hiraishi | G02B 5/0231 362/339 |
| 2010/0232142 | A1* | 9/2010 | Kim | G02B 5/0242 362/97.2 |
| 2011/0198987 | A1* | 8/2011 | Yamada | B82Y 20/00 313/504 |
| 2012/0170282 | A1* | 7/2012 | Lin | G02B 6/0036 362/341 |
| 2012/0230053 | A1* | 9/2012 | Griffiths | G02B 6/0036 362/605 |
| 2013/0003415 | A1* | 1/2013 | Park | G02B 6/0038 362/627 |

FOREIGN PATENT DOCUMENTS

| JP | 2004-271666 A | 9/2004 |
| JP | 2005-316413 A | 11/2005 |
| JP | 2006-190573 A | 7/2006 |
| JP | 2008-145499 A | 6/2008 |
| JP | 2008-243669 A | 10/2008 |
| JP | 2010-205512 A | 9/2010 |
| JP | 2010-212204 A | 9/2010 |
| JP | 2011-009229 A | 1/2011 |
| JP | 2011-165444 A | 8/2011 |
| TW | 201108847 A | 3/2011 |
| WO | 2011/010582 A1 | 1/2011 |
| WO | 2011/148823 A1 | 12/2011 |

OTHER PUBLICATIONS

Decision to Grant a Patent issued in corresponding Japanese Patent Application No. 2013-534088 dated Jan. 24, 2014.

* cited by examiner

LIGHT EXTRACTION FILM FOR EL ELEMENTS, SURFACE LIGHT EMITTING BODY, AND METHOD FOR PRODUCING LIGHT EXTRACTION FILM FOR EL ELEMENTS

TECHNICAL FIELD

The present invention relates to a light extraction film for EL devices, a surface light emitter, and a method for producing a light extraction film for EL devices.

The invention relates to a technique for extracting light from an EL (electroluminescence) device, in particular an EL device of a surface emitting body which has an organic EL light emitting device as a light emitting source.

This application claims priority based on Japanese Patent Application No. 2012-169546 which has been filed in Japan on Jul. 31, 2012, and the content of which is incorporated herein by reference.

BACKGROUND ART

Among surface light emitting bodies, an EL device is expected to be used for a flat panel display, and it is furthermore expected to be used as next-generation luminaries for replacing fluorescent lamps or the like.

The structure of an EL device is diversified, that is, from a simple structure in which an organic thin film to be a light emitting layer is merely disposed between two films to a multi-layered structure. As an example of the latter multi-layered structure, those obtained by laminating a positive hole transport layer, a light emitting layer, an electron transport layer, and a negative electrode on a positive electrode formed on a glass substrate can be mentioned. The layer sandwiched between the positive electrode and negative electrode entirely consists of an organic thin film, and the thickness of each organic thin film is extremely thin, that is, only several tens of nm.

The EL device is a laminate of thin films, and based on a difference in refractive index between the materials of each thin film, the total reflection angle of the light between thin films is determined. Under the current circumstances, about 80% of the light generated from the light emitting layer are trapped inside the EL device and cannot be extracted to the outside. Specifically, when the refractive index of a glass substrate is 1.5 and the refractive index of an air layer is 1.0, the critical angle $\theta_c$ is 41.8° and the light with the incident angle lower than the critical angle $\theta_c$ is emitted from the glass substrate to the air layer. However, the light with the incident angle higher than the critical angle $\theta_c$ undergoes total reflection and is trapped inside the glass substrate. For such reasons, it has been desired to achieve the light extracting function for extracting the light trapped inside a glass substrate on a surface of an EL device to the outside of the glass substrate, that is, to improve the light extraction efficiency and luminance in the normal direction.

Further, with regard to an EL device which performs isotropic light emission, it is also desired to have not only improvement in the light extraction efficiency and luminance in the normal direction but also small emission angle dependence of the wavelength of light emitted from an EL device. Specifically, it is desired to have a small difference in emission angle according to the wavelength when emitted light from a light emitting layer passes through a glass substrate to result in light emission from the glass substrate.

In other words, the wavelength dependence of the light distribution emitted from a glass substrate is desired to be as small as possible.

To solve the problems described above, a film containing light diffusion fine particles is suggested in Patent Document 1. Further, a film having a convex-concave structure with a pyramid shape is suggested in Patent Document 2.

CITATION LIST

Patent Document

Patent Document 1: JP 2010-212204 A
Patent Document 2: JP 2011-9229 A

DISCLOSURE OF THE INVENTION

Problem to be Solved by the Invention

However, although the light extraction efficiency of a surface light emitter is improved with the film described in Patent Document 1, the content of fine particles is low, that is, 10% by mass, and therefore the emission angle dependence of the wavelength of light emitted from the surface light emitter is poor. Further, although the emission angle dependence of the wavelength of the light emitted from a surface light emitter is improved with the film described in Patent Document 2, the light extraction efficiency or luminance in the normal direction of the surface light emitter is poor.

Accordingly, an object of the invention is to provide a light extraction film for EL devices, which enables a surface light emitter to have a good balance between improvement of light extraction efficiency and luminance in the normal direction and suppression of emission angle dependence of the wavelength of emitted light, and a surface light emitter which has improved light extraction efficiency and luminance in the normal direction, while being suppressed in emission angle dependence of the wavelength of emitted light.

Means for Solving Problem

According to the invention, a light extraction film for EL devices including a convex-concave structure, in which the convex-concave structure is provided with a plurality of spherical protrusions, each of which contains a resin and fine particles added into the resin, a content of the fine particles in the spherical protrusions is 22 to 55% by mass, and an average maximum diameter $A_{ave}$ of the bottom portions of the spherical protrusions and a volume average particle diameter P of the fine particles satisfy the following Mathematical Formula (1)

$$A_{ave}/P \geq 5 \qquad (1),$$

is provided to achieve the aforementioned purpose.

Further, according to the invention, a surface light emitter containing the light extraction film for EL devices described above is provided to achieve the aforementioned purpose.

Still further, according to the invention, a method for producing the light extraction film for EL devices described above, in which a mixture consisting of an active energy ray curable composition and fine particles is filled between an outer peripheral surface of a roll mold and a base material while rotating the roll mold with an outer peripheral surface, on which a plurality of transfer parts of the protrusions with a concave shape are arranged, and running the base material in a rotational direction of the roll mold along the outer peripheral surface of the roll mold, and the active energy ray curable composition is cured all at once in a state in which the mixture is sandwiched between the outer peripheral surface of the roll mold and the base material by irradiating a region between the outer peripheral surface of the roll mold and the base material with an active energy ray, is provided to achieve the aforementioned purpose.

Effect of the Invention

With the light extraction film for EL devices of the invention, a surface light emitter having excellent light extraction efficiency and luminance in the normal direction and being capable of sufficiently suppressing emission angle dependence of the wavelength of emitted light can be obtained. Further, the surface light emitter of the invention has excellent light extraction efficiency and luminance in the normal direction and sufficiently suppressed emission angle dependence of the wavelength of emitted light. Further, with the method for producing the light extraction film for EL devices of the invention, the aforementioned light extraction film for EL devices can be easily and efficiently provided.

BEST MODE(S) FOR CARRYING OUT THE INVENTION

Figure 1:
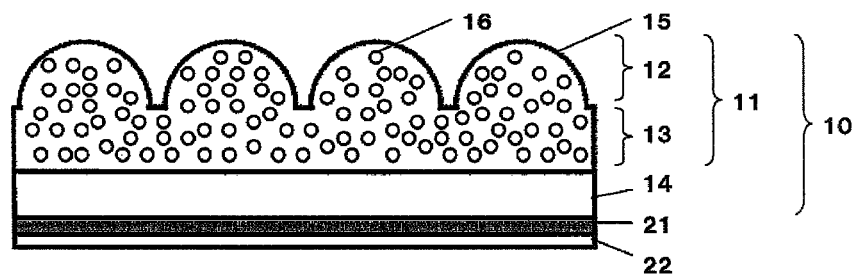
FIG. 1 is a schematic diagram illustrating an exemplary cross section of a light extraction film for EL devices of the invention.

Hereinbelow, the embodiments of the invention are described by way of the drawings, but the invention is not limited to the embodiments that are described in the drawings. Meanwhile, as described herein, the light extraction film for EL devices may be abbreviated as an "optical film."

(Light Extraction Film 10 for EL Devices)

As a light extraction film for EL devices of the invention, the optical film (light extraction film 10 for EL devices) illustrated in FIG. 1 may be mentioned. According to combination with an EL device as a light emitting source, the light extraction film 10 for EL devices exhibits a function of extracting light from the corresponding EL device.

The light extraction film 10 for EL devices has the convex-concave structure 12 on one surface thereof (top surface in FIG. 1). The convex-concave structure 12 has a plurality of the spherical protrusions 15 arranged thereon. The light extraction film 10 for EL devices is provided with the base material 14. The other surface of the light extraction film 10 for EL devices (bottom surface in FIG. 1) consists of a bottom surface of the base material 14. Because the light extraction film 10 for EL devices has excellently maintained shape of the spherical protrusions 15, it is preferable to have the base layer 13 interposed between the base material 14 and the convex-concave structure 12. With the convex-concave structure 12 and the base layer 13, the convex-concave structure layer 11 is constituted.

Because the light extraction film 10 for EL devices also has excellent handlability and easiness for application on EL devices, it is preferable that the adhesion layer 21 and the protection film 22 be laminated in order on the bottom surface of the base material 14.

Hereinbelow, each constitutional part of the light extraction film 10 for EL devices is described in greater detail.

(Convex-Concave Structure 12)

The convex-concave structure 12 has a role of improving the light extraction efficiency and the luminance in the normal direction of a surface light emitter based on the shape of the spherical protrusions 15 and also suppressing the emission angle dependence of the wavelength of emitted light of a surface light emitter based on inclusion of the fine particle 16.

(Spherical Protrusions 15)

The convex-concave structure 12 is constituted with arrangement of a plurality of the spherical protrusions 15. By having the convex-concave structure 12 which includes a plurality of the spherical protrusions 15, the light extraction efficiency and the luminance in the normal direction of a surface light emitter can be improved. As described herein, the spherical protrusions 15 indicates protrusions with a spherical segment shape, a spherical segment trapezoidal shape, an ellipsoid spherical segment shape (a shape obtained by cutting a spherodial ellipsoid along one flat surface), or an ellipsoid spherical segment trapezoidal shape (a shape obtained by cutting a spherodial ellipsoid along two parallel flat surfaces). The spherical protrusions 15 may be used either singly or in combination of two or more types. Among those spherical protrusions 15, from the viewpoint of having an excellent function of improving the light extraction efficiency and the luminance in the normal direction of a surface light emitter, the protrusions of a spherical segment shape and an ellipsoid spherical segment shape are preferable.

Figure 2:
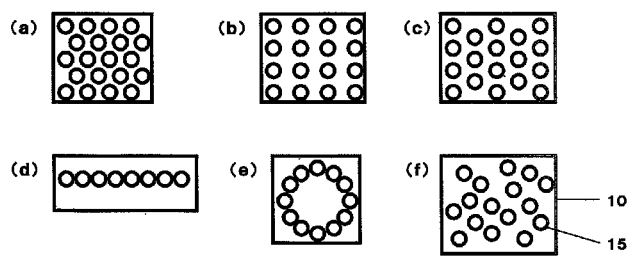
FIG. 2 is a schematic diagram illustrating an exemplary arrangement of a convex-concave structure of the light extraction film for EL devices of the invention, as seen from above the light extraction film for EL devices.

An exemplary arrangement of the spherical protrusions 15 of the convex-concave structure 12 is illustrated in FIG. 2.

With regard to the arrangement of the spherical protrusions 15 of the convex-concave structure 12, examples thereof include a hexagonal arrangement (FIG. 2(a)), a rectangular arrangement (FIG. 2(b)), a rhomboidal arrangement (FIG. 2(c)), a linear arrangement (FIG. 2(d)), a circular arrangement (FIG. 2(e)), and a random arrangement (FIG.

2(*f*)). Among those arrangements of the spherical protrusions 15 of the convex-concave structure 12, from the viewpoint of having an excellent function of improving the light extraction efficiency and the luminance in the normal direction of a surface light emitter, the hexagonal arrangement, rectangular arrangement, and rhomboidal arrangement are preferable, and the hexagonal arrangement and rectangular arrangement are more preferable.

Figure 3:
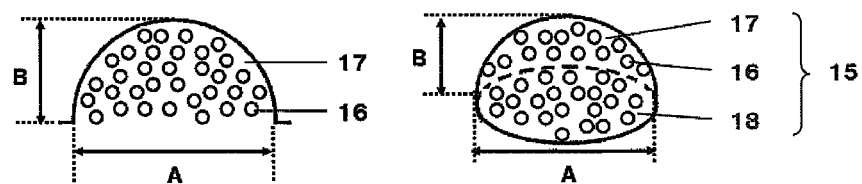
FIG. 3 is a schematic diagram illustrating an exemplary convex-concave structure of the light extraction film for EL devices of the invention.

One example of the spherical protrusions 15 is illustrated in FIG. 3.

As described herein, the bottom portion 18 of the spherical protrusions 15 indicates a hypothetical plane-shape portion that is surrounded by an outer periphery of the bottom portion of the spherical protrusions 15 (when there is the base layer 13, a surface in contact with the base layer 13).

Further, as described herein, the maximum diameter A of the bottom portion 18 of the spherical protrusions 15 indicates the length of the longest part in the bottom portion 18 of the spherical protrusions 15. With regard to the average maximum diameter $A_{ave}$ of the bottom portion 18 of the spherical protrusions 15, the surface having the spherical protrusions 15 of the light extraction film 10 for EL devices is photographed with a scanning-type microscope, the maximum diameter A of the bottom portion 18 of the spherical protrusions 15 is measured at five positions, and their average value is taken.

Further, as described herein, the height B of the spherical protrusions 15 indicates the height from the bottom portion 18 of the spherical protrusions 15 to the highest point. With regard to the average height $B_{ave}$ of the spherical protrusions 15, a cross section of the light extraction film 10 for EL devices is photographed with a scanning-type microscope, the height B of the spherical protrusions 15 is measured at five positions, and their average value is taken.

The average maximum diameter $A_{ave}$ of the bottom portion 18 of the spherical protrusions 15 is, from the viewpoint of having an excellent function of improving the light extraction efficiency and the luminance in the normal direction of a surface light emitter, preferably 0.5 to 150 µm, more preferably 1 to 130 µm, and still more preferably 2 to 100 µm.

The average height $B_{ave}$ of the spherical protrusions 15 is, from the viewpoint of having an excellent function of improving the light extraction efficiency and the luminance in the normal direction of a surface light emitter, preferably 10 to 100 µm, more preferably 12 to 80 µm, and still more preferably 15 to 60 µm.

The aspect ratio of the spherical protrusions 15 is, from the viewpoint of having an excellent function of improving the light extraction efficiency and the luminance in the normal direction of a surface light emitter, preferably 0.3 to 1.4, more preferably 0.35 to 1.3, and still more preferably 0.4 to 1.0.

Meanwhile, the aspect ratio of the spherical protrusions 15 is calculated from [Average height $B_{ave}$ of the spherical protrusions 15]/[Average maximum diameter $A_{ave}$ of the bottom portion 18 of the spherical protrusions 15].

(Bottom Portion 18 of Spherical Protrusions 15)

Examples of the shape of the bottom portion 18 of the spherical protrusions 15 include a circular shape and an elliptical shape. Shape of the bottom portion 18 of the spherical protrusions 15 may be used either singly or in combination of two or more types. Among those shapes of the bottom portion 18 of the spherical protrusions 15, from the viewpoint of having an excellent function of improving the light extraction efficiency and the luminance in the normal direction of a surface light emitter, a circular shape and an elliptical shape are preferable and a circular shape is more preferable.

Figure 4:
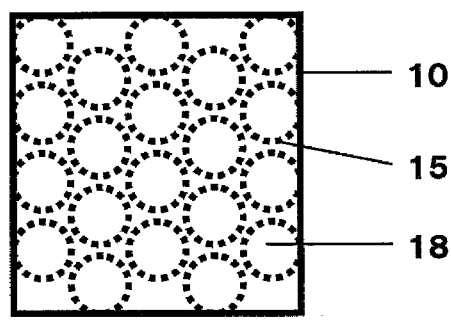
FIG. 4 is a schematic diagram illustrating an exemplary light extraction film for EL devices of the invention, as seen from above the light extraction film for EL devices.

One example of the light extraction film for EL devices as seen from above is illustrated in FIG. 4.

The ratio of total area of each bottom portion 18 of every spherical protrusions 15 (the area surrounded by a broken line illustrated in FIG. 4) compared to the area of the light extraction film 10 for EL devices (the area surrounded by an un-broken line illustrated in FIG. 4) is, from the viewpoint of having an excellent function of improving the light extraction efficiency and the luminance in the normal direction of a surface light emitter, preferably 20 to 99%, more preferably 25 to 95%, still more preferably 30 to 93%, and particularly preferably 50 to 90%.

Meanwhile, when all the bottom portions 18 of the spherical protrusions 15 have a circular shape with the same size, the maximum value of the ratio of the total area of the bottom portions 18 of the spherical protrusions 15 compared to the area of the light extraction film 10 for EL devices is 91% or so.

(Base Layer 13)

The base layer 13 has a role of maintaining the shape of the spherical protrusions 15 by alleviating the stress accompanied with polymerization shrinking or the like during curing of a resin composition. Further, as illustrated in FIG. 1, when the base layer 13 includes the fine particle 16, the function of a surface light emitter to suppress the emission angle dependence of the wavelength of emitted light is further enhanced.

The thickness of the base layer 13 is preferably 3 to 50 µm, more preferably 5 to 45 µm, and still more preferably 10 to 40 µm. When the thickness of the base layer 13 is 3 µm or more, the function of a surface light emitter to suppress the emission angle dependence of the wavelength of emitted light is further enhanced by including the fine particle 16. Further, when the thickness of the base layer 13 is 50 µm or less, a decrease in the function of improving the light extraction efficiency and the luminance in the normal direction of a surface light emitter that is caused by scattering can be suppressed.

The spherical protrusions 15 of the convex-concave structure 12 of the invention include the resin 17 and the fine particle 16.

When the light extraction film 10 for EL devices of the invention includes the convex-concave structure layer 11 in which the convex-concave structure 12 is present on a surface of the base layer 13 as illustrated in FIG. 1, the fine particle 16 may be present only in the convex-concave structure 12 or present in both of the convex-concave structure 12 and the base layer 13. However, from the viewpoint of having excellent productivity of the light extraction film 10 for EL devices and higher function of suppressing the emission angle dependence of the wavelength of emitted light of a surface light emitter, the fine particle 16 is preferably included in both of the convex-concave structure 12 and the base layer 13. It is also preferable that the content of the fine particle 16 in the spherical protrusions 15 of the convex-concave structure 12 be substantially the same to that of the base layer 13.

(Resin 17)

As for the resin 17, it is not particularly limited as long as it is a resin with high light transmittance in the wavelength range of visible light (approximately 400 to 700 nm). Examples thereof include an acrylic resin; a polycarbonate resin; a polyester resin such as polyethylene terephthalate, polybutylene terephthalate, and polyethylene naphthalate;

polystyrene; a styrene resin such as polystyrene or an ABS resin; and a vinyl chloride resin. Among those resins, from the viewpoint of having high light transmittance in the wavelength range of visible light and excellent properties in heat resistance, dynamic properties, and molding processability, the acrylic resin is preferable.

When the light extraction film 10 for EL devices of the invention includes the convex-concave structure layer 11 in which the convex-concave structure 12 is present on a surface of the base layer 13, the resin 17 may either be the same or different in the convex-concave structure 12 and the base layer 13. However, from the viewpoint of having high productivity of the light extraction film 10 for EL devices, it is preferable to use the same resin 17 for both of the convex-concave structure 12 and the base layer 13.

From the viewpoint of having high productivity of the light extraction film 10 for EL devices, the resin 17 is preferably a cured resin obtained by curing an active energy ray curable composition with irradiation of an active energy ray.

Examples of the active energy ray include ultraviolet rays, electron beam, X rays, infrared rays, and visible rays. Among those active energy rays, from the viewpoint of having an excellent curing property of an active energy ray curable composition and suppressing a deterioration of the light extraction film 10 for EL devices, ultraviolet rays and electron beam are preferable, and ultraviolet rays are more preferable.

The active energy ray curable composition is not particularly limited as long as it can be cured by active energy ray. However, from the viewpoint of having excellent handlability or a curing property of an active energy ray curable composition and various excellent physical properties of the light extraction film 10 for EL devices including flexibility, heat resistance, abrasion resistance, solvent resistance, and a light transmitting property, an active energy ray curable composition containing the polymerizable monomer (A), the cross-linkable monomer (B), and the polymerization initiator (C) is preferable.

Examples of the polymerizable monomer (A) include (meth)acrylates such as methyl(meth)acrylate, ethyl(meth) acrylate, n-propyl(meth)acrylate, iso-propyl(meth)acrylate, n-butyl(meth)acrylate, iso-butyl(meth)acrylate, sec-butyl (meth)acrylate, tert-butyl(meth)acrylate, n-hexyl(meth) acrylate, cyclohexyl(meth)acrylate, n-octyl(meth)acrylate, 2-ethylhexyl(meth)acrylate, dodecyl(meth)acrylate, tridecyl (meth)acrylate, stearyl(meth)acrylate, alkyl(meth)acrylate, phenyl(meth)acrylate, benzyl(meth)acrylate, phenoxyethyl (meth)acrylate, isobornyl(meth)acrylate, glycidyl(meth) acrylate, tetrahydrofurfuryl(meth)acrylate, norbornyl(meth) acrylate, adamantyl(meth)acrylate, dicyclopentenyl(meth) acrylate, dicyclopentanyl(meth)acrylate, tetracyclododecanyl(meth)acrylate, cyclohexane dimethanol mono(meth)acrylate, 2-hydroxyethyl(meth)acrylate, 2-hydroxypropyl(meth)acrylate, 3-hydroxypropyl(meth) acrylate, 2-hydroxybutyl(meth)acrylate, 3-hydroxybutyl (meth)acrylate, 4-hydroxybutyl(meth)acrylate, 2-methoxyethyl(meth)acrylate, 2-ethoxyethyl(meth)acrylate, 3-methoxybutyl(meth)acrylate, butoxyethyl(meth)acrylate, methoxytriethylene glycol(meth)acrylate, methoxydipropylene glycol(meth)acrylate, 2-(meth)acryloyloxymethyl-2-methylbicycloheptane, 4-(meth)acryloyloxymethyl-2-methyl-2-ethyl-1,3-dioxolane, 4-(meth)acryloyloxymethyl-2-methyl-2-isobutyl-1,3-dioxolane, trimethylol propaneformal(meth)acrylate, ethylene oxide modified phosphoric acid(meth)acrylate, or caprolactone modified phosphoric acid(meth)acrylate; (meth)acrylic acid; (meth) acrylonitrile; (meth)acrylamides such as (meth)acrylamide, N-dimethyl(meth)acrylamide, N-diethyl(meth)acrylamide, N-butyl(meth)acrylamide, dimethylaminopropyl(meth) acrylamide, N-methylol(meth)acrylamide, N-methoxymethyl(meth)acrylamide, N-butoxymethyl(meth)acrylamide, (meth)acryloylmorpholine, hydroxyethyl(meth)acrylamide, or methylene bis(meth)acrylamide; epoxy(meth)acrylates like a compound resulting from reaction of (meth)acrylic acid or derivatives thereof with a bisphenol type epoxy resin obtained by condensation reaction between bisphenols (bisphenol A, bisphenol F, bisphenol S, tetrabromo bisphenol A or the like) and epichlorohydrin; aromatic vinyls such as styrene or α-methyl styrene; vinyl ethers such as vinyl methyl ether, vinyl ethyl ether, or 2-hydroxyethyl vinyl ether; vinyl carboxylates such as vinyl acetate or vinyl butyrate; and olefins such as ethylene, propylene, butene, or isobutene. The polymerizable monomer (A) may be used either singly or in combination of two or more types. Among those polymerizable monomers (A), from the viewpoint of having excellent handlability or a curing property of an active energy ray curable composition and various excellent physical properties of the light extraction film 10 for EL devices including flexibility, heat resistance, abrasion resistance, solvent resistance, and a light transmitting property, (meth)acrylates, epoxy(meth)acrylates, aromatic vinyls, and olefins are preferable. (Meth)acrylates and epoxy(meth) acrylates are more preferable.

As described herein, (meth)acrylate indicates acrylate or methacrylate.

Content of the polymerizable monomer (A) in the active energy ray curable composition is preferably 0.5 to 60% by mass, more preferably 1 to 57% by mass, and still more preferably 2 to 55% by mass in the entire amount of the active energy ray curable composition. When the content of the polymerizable monomer (A) is 0.5% by mass or more, the handlability of the active energy ray curable composition is excellent and the base material adhesion property of the light extraction film 10 for EL devices is excellent. Further, when the content of the polymerizable monomer (A) is 60% by mass or less, the cross-linking property and curing property of the active energy ray curable composition are excellent and the solvent resistance of the light extraction film 10 for EL devices is excellent.

Examples of the cross-linkable monomer (B) include hexa(meth)acrylates such as dipentaerythritol hexa(meth) acrylate or caprolactone modified dipentaerythritol hexa (meth)acrylate; penta(meth)acrylates such as dipentaerythritol hydroxypenta(meth)acrylate or caprolactone modified dipentaerythritol hydroxypenta(meth)acrylate; tetra(meth) acrylates such as ditrimethylol propanetetra(meth)acrylate, pentaerythritol tetra(meth)acrylate, pentaerythritol ethoxy modified tetra(meth)acrylate, dipentaerythritol hexa(meth) acrylate, dipentaerythritol penta(meth)acrylate, or tetramethylol methanetetra(meth)acrylate; tri(meth)acrylates such as trimethylol propane tri(meth)acrylate, trisethoxylated trimethylol propanetri(meth)acrylate, pentaerythritol tri (meth)acrylate, ethoxylated pentaerythritol tri(meth)acrylate, tris(2-(meth)acryloyloxyethyl)isocyanurate, trimethylol propanetri(meth)acrylate modified with aliphatic hydrocarbons with 2 to 5 carbon atoms, or isocyanuric acid ethylene oxide modified tri(meth)acrylate; di(meth)acrylates such as triethylene glycol di(meth)acrylate, diethylene glycol di(meth)acrylate, 1,3-butylene glycol di(meth)acrylate, 1,4-butanediol di(meth)acrylate, 1,5-pentanediol di(meth) acrylate, 1,6-hexanediol di(meth)acrylate, nonane diol di(meth)acrylate, neopentyl glycol di(meth)acrylate, methylpentanediol di(meth)acrylate, diethylpentanediol di(meth)

acrylate, hydroxypyvalic acid neopentyl glycol di(meth) acrylate, tetraethylene glycol di(meth)acrylate, tripropylene glycol di(meth)acrylate, polybutylene glycol di(meth)acrylate, tricyclodecane dimethanol di(meth)acrylate, 2,2-bis(4-(meth)acryloxypolyethoxyphenyl)propane, 2,2-bis(4-(meth) acryloxyethoxyphenyl)propane, 2,2-bis(4-(3-(meth) acryloxy-2-hydroxypropoxy)phenyl)propane, 1,2-bis(3-(meth)acryloxy-2-hydroxypropoxy)ethane, 1,4-bis(3-(meth) acryloxy-2-hydroxypropoxy)butane, bis(2-(meth) acryloyloxyethyl)-2-hydroxyethylisocyanurate, cyclohexane dimethanol di(meth)acrylate, dimethylol tricyclodecane di(meth)acrylate, hydroxypyvalic acid neopentyl glycol di(meth)acrylate, polyethoxylated cyclohexane dimethanol di(meth)acrylate, polypropoxylated cyclohexane dimethanol di(meth)acrylate, polyethoxylated bisphenol A di(meth)acrylate, polypropoxylated bisphenol A di(meth) acrylate, hydrogenated bisphenol A di(meth)acrylate, polyethoxylated hydrogenated bisphenol A di(meth)acrylate, polypropoxylated hydrogenated bisphenol A di(meth)acrylate, bisphenoxyfluorene ethanol di(meth)acrylate, neopentyl glycol modified trimethylol propane di(meth)acrylate, di(meth)acrylate of ε-caprolactone adduct of hydroxypyvalic acid neopentyl glycol, di(meth)acrylate of γ-butyrolactone adduct of hydroxypyvalic acid neopentyl glycol, di(meth)acrylate of caprolactone adduct of neopentyl glycol, di(meth)acrylate of caprolactone adduct of butylene glycol, di(meth)acrylate of caprolactone adduct of cyclohexane dimethanol, di(meth)acrylate of caprolactone adduct of dicyclopentanediol, di(meth)acrylate of ethylene oxide adduct of bisphenol A, di(meth)acrylate of propylene oxide adduct of bisphenol A, di(meth)acrylate of caprolactone adduct of bisphenol A, di(meth)acrylate of caprolactone adduct of hydrogenated bisphenol A, di(meth)acrylate of caprolactone adduct of bisphenol F, or isocyanuric acid ethylene oxide modified di(meth)acrylate; diallyls such as diallylphthalate, diallylterephthalate, diallylisophthalate, or diethylene glycol diallylcarbonate; allyl(meth)acrylate; divinyl benzene; methylene bisacrylamide; polyester di(meth) acrylates such as a compound obtained by a reaction between polybasic acid (phthalic acid, succinic acid, hexahydrophthalic acid, tetrahydrophthalic acid, terephthalic acid, azellaic acid, adipic acid, or the like), polyhydric alcohol (ethylene glycol, hexanediol, polyethylene glycol, polytetramethylene glycol) and (meth)acrylic acid or derivatives thereof; urethane polyfunctional(meth)acrylates such as a compound obtained by a reaction between a diisocyanate compound (tolylene diisocyanate, isophorone diisocyanate, xylene diisocyanate, dicyclohexylmethane diisocyanate, hexamethylene diisocyanate, or the like) and a hydroxyl group-containing (meth)acrylate (polyfunctional (meth)acrylate such as 2-hydroxyethyl(meth)acrylate, 2-hydroxypropyl(meth)acrylate, 4-hydroxybutyl(meth)acrylate, or pentaerythritol tri(meth)acrylate) or a compound obtained by reacting a hydroxyl group-containing (meth)acrylate with an isocyanate group which has been left after adding a diisocyanate compound to a hydroxyl group of alcohols (one type or two or more types of alkane diol, polyether diol, polyester diol, and spiroglycol compound); divinyl ethers such as diethylene glycol divinyl ether or triethylene glycol divinyl ether; and dienes such as butadiene, isoprene, or dimethyl butadiene. The cross-linkable monomer (B) may be used either singly or in combination of two or more types. Among those cross-linkable monomers (B), from the viewpoint of having various excellent physical properties of the light extraction film 10 for EL devices including flexibility, heat resistance, abrasion resistance, solvent resistance, and a light transmitting property, hexa(meth)acrylates, penta(m-eth)acrylates, tetra(meth)acrylates, tri(meth)acrylates, di(meth)acrylates, diallyls, allyl(meth)acrylate, polyester di(meth)acrylates and urethane polyfunctional(meth)acrylates are preferable. Hexa(meth)acrylates, penta(meth)acrylates, tetra(meth)acrylates, tri(meth)acrylates, di(meth)acrylates, polyester di(meth)acrylates and urethane polyfunctional(meth)acrylates are more preferable.

Content of the cross-linkable monomer (B) in the active energy ray curable composition is preferably 30 to 98% by mass, more preferably 35 to 97% by mass, and still more preferably 40 to 96% by mass in the entire amount of the active energy ray curable composition. When the content of the cross-linkable monomer (B) is 30% by mass or more, the cross-linking property and curing property of the active energy ray curable composition are excellent and the solvent resistance of the light extraction film 10 for EL devices is excellent. Further, when the content of the cross-linkable monomer (B) is 98% by mass or less, the flexibility of the light extraction film 10 for EL devices is excellent.

Examples of the polymerization initiator (C) include a carbonyl compound such as benzoin, benzoin methyl ether, benzoin ethyl ether, benzoin isopropyl ether, benzoin isobutyl ether, acetoin, benzyl, benzophenone, p-methoxybenzophenone, 2,2-diethoxyacetophenone, α,α-dimethoxy-α-phenylacetophenone, benzyl dimethyl ketal, methylphenyl glyoxylate, ethylphenyl glyoxylate, 4,4'-bis(dimethylamino) benzophenone, 1-hydroxycyclohexyl phenyl ketone, 2-hydroxy-2-methyl-1-phenylpropane-1-one, or 2-ethylanthraquinone; a sulfur compound such as tetramethylthiuram monosulfide or tetramethylthiuram disulfide; and acyl phosphine oxides such as 2,4,6-trimethylbenzoyl diphenylphosphine oxide or benzoyl diethoxy phosphine oxide. The polymerization initiator (C) may be used either singly or in combination of two or more types. Among those polymerization initiators (C), from the viewpoint of having excellent handlability or a curing property of an active energy ray curable composition and an excellent light transmitting property of the light extraction film 10 for EL devices, carbonyl compounds and acylphosphine oxide are preferable, and carbonyl compounds are more preferable.

Content of the polymerization initiator (C) in the active energy ray curable composition is preferably 0.1 to 10% by mass, more preferably 0.5 to 8% by mass, and still more preferably 1 to 5% by mass in the entire amount of the active energy ray curable composition. When the content of the polymerization initiator (C) is 0.1% by mass or more, the handlability and curing property of the active energy ray curable composition are excellent. Further, when the content of the polymerization initiator (C) is 10% by mass or less, the light transmitting property of the light extraction film 10 for EL devices is excellent.

The refractive index of the resin 17 is, from the viewpoint of having an excellent light transmitting property of the light extraction film 10 for EL devices, preferably 1.40 to 2.00, more preferably 1.43 to 1.95, and still more preferably 1.46 to 1.90.

Content of the resin 17 in the convex-concave structure 12 is 45 to 78% by mass, preferably 50 to 76% by mass, and more preferably 55 to 73% by mass. When the content of the resin 17 in the convex-concave structure 12 is 45% by mass or more, molding of the spherical protrusions 15 can be easily performed. Further, when the content of the resin 17 in the convex-concave structure 12 is 78% by mass or less, the function of a surface light emitter to suppress the emission angle dependence of the wavelength of emitted light is enhanced.

(Fine Particle 16)

As for the fine particle 16, it is not particularly limited as long as it is a fine particle having a light diffusion property in the wavelength range of visible light (approximately 400 to 700 nm) and known fine particle may be used. The fine particle 16 may be used either singly or in combination of two or more types.

Examples of a material of the fine particle 16 include a metal such as gold, silver, silicon, aluminum, magnesium, zirconium, titanium, zinc, germanium, indium, tin, antimony, or cerium; a metal oxide such as silicon oxide, aluminum oxide, magnesium oxide, zirconium oxide, titanium oxide, zinc oxide, germanium oxide, indium oxide, tin oxide, indium tin oxide, antimony oxide, or cerium oxide; a metal hydroxide such as aluminum hydroxide; a metal carbonate such as magnesium carbonate; a metal nitride such as silicon nitride; and a resin such as an acrylic resin, a styrene resin, a silicone resin, an urethane resin, a mealmine resin, or an epoxy resin. The material of the fine particle 16 may be used either singly or in combination of two or more types. Among those materials of the fine particle 16, from the viewpoint of having excellent handlability during production of the light extraction film 10 for EL devices, silicon, aluminum, magnesium, silicon oxide, aluminum oxide, magnesium oxide, aluminum hydroxide, magnesium carbonate, an acrylic resin, a styrene resin, a silicone resin, a urethane resin, a melamine resin, and an epoxy resin are preferable. Silicon oxide, aluminum oxide, aluminum hydroxide, magnesium carbonate, an acrylic resin, a styrene resin, a silicone resin, a urethane resin, a melamine resin, and an epoxy resin are more preferable.

When the light extraction film 10 for EL devices of the invention includes the convex-concave structure layer 11 in which the convex-concave structure 12 is present on a surface of the base layer 13 as illustrated in FIG. 1, the fine particle 16 may be the same or different from each other between the convex-concave structure 12 and the base layer 13. However, from the viewpoint of having excellent productivity of the light extraction film 10 for EL devices, it is preferable to use the same fine particle 16 in both of the convex-concave structure 12 and the base layer 13.

The refractive index of the fine particle 16 is, from the viewpoint of having an excellent light transmitting property of the light extraction film 10 for EL devices, preferably 1.30 to 2.00, more preferably 1.35 to 1.95, and still more preferably 1.40 to 1.90.

The volume average particle diameter P of the fine particle 16 is preferably 0.5 to 20 μm, more preferably 1 to 15 μm, and still more preferably 1.5 to 10 μm. When the volume average particle diameter P of the fine particle 16 is preferably 0.5 μm or more, light of visible wavelength range can be effectively scattered. Further, when the volume average particle diameter P of the fine particle 16 is preferably 20 μm or less, the function of a surface light emitter to suppress the emission angle dependence of the wavelength of emitted light is enhanced.

The ratio between the average maximum diameter $A_{ave}$ of the bottom portion 18 of the spherical protrusions 15 and the volume average particle diameter P of the fine particle 16 is, from the viewpoint of having excellent light extraction efficiency and the luminance in the normal direction of a surface light emitter and enhancing the function of suppressing the emission angle dependence of the wavelength of emitted light, 5 or more, that is, it satisfies the Mathematical Formula (1) below:

$$A_{ave}/P \geq 5 \qquad (1)$$

$A_{ave}/P$ is preferably 7 or more, and more preferably 10 or more.

Meanwhile, the ratio between the average maximum diameter $A_{ave}$ of the bottom portion 18 of the spherical protrusions 15 and the volume average particle diameter P of the fine particle 16 is calculated from [Average maximum diameter $A_{ave}$ of the bottom portion 18 of the spherical protrusions 15]/[Volume average particle diameter P of the fine particle 16].

Examples of the shape of the fine particle 16 include a spherical shape, a column shape, a cubic shape, a rectangular shape, a pyramid shape, a cone shape, a star shape, and an amorphous shape. The shape of the fine particle 16 may be used either singly or in combination of two or more types. Among those shapes of the fine particle 16, from the viewpoint of effective scattering light in visible wavelength range, a spherical shape, a cubic shape, a rectangular shape, a pyramid shape, and a star shape are preferable, and a spherical shape is more preferable.

Content of the fine particle 16 in the convex-concave structure 12, that is, content of the fine particle 16 in the spherical protrusions 15, is 22 to 55% by mass, preferably 24 to 50% by mass, and more preferably 27 to 45% by mass. When the content of the fine particle 16 in the convex-concave structure 12 is 22% by mass or more, the function of a surface light emitter to suppress the emission angle dependence of the wavelength of emitted light is enhanced. Further, when the content of the fine particle 16 in the convex-concave structure 12 is 55% by mass or less, molding of the spherical protrusions 15 can be easily performed.

By having a difference in refractive index between the resin 17 and the fine particle 16, the light diffusing effect of the fine particle 16 occurs. The difference in refractive index between the resin 17 and the fine particle 16 is preferably 0.04 to 0.20, more preferably 0.05 to 0.17, and still more preferably 0.07 to 0.15. When the difference in refractive index between the resin 17 and the fine particle 16 is 0.04 or more, the function of a surface light emitter to suppress the emission angle dependence of the wavelength of emitted light of a surface light emitter is enhanced. Further, when the difference in refractive index between the resin 17 and the fine particle 16 is 0.20 or less, excellent light extraction efficiency and the luminance in the normal direction of a surface light emitter are obtained.

Examples of a combination of the resin 17 and the fine particle 16 include the followings; the resin 17 is an acrylic resin and the fine particle 16 is a silicon fine particle, the resin 17 is an acrylic resin and the fine particle 16 is an aluminum fine particle, the resin 17 is an acrylic resin and the fine particle 16 is a magnesium fine particle, the resin 17 is an acrylic resin and the fine particle 16 is a silicon oxide fine particle, the resin 17 is an acrylic resin and the fine particle 16 is an aluminum oxide fine particle, the resin 17 is an acrylic resin and the fine particle 16 is a magnesium oxide fine particle, the resin 17 is an acrylic resin and the fine particle 16 is an aluminum hydroxide fine particle, the resin 17 is an acrylic resin and the fine particle 16 is a magnesium carbonate fine particle, the resin 17 is an acrylic resin and the fine particle 16 is an acrylic resin fine particle, the resin 17 is an acrylic resin and the fine particle 16 is a styrene resin fine particle, the resin 17 is an acrylic resin and the fine particle 16 is a silicone resin fine particle, the resin 17 is an acrylic resin and the fine particle 16 is a urethane resin fine particle, the resin 17 is an acrylic resin and the fine particle 16 is a melamine resin fine particle, the resin 17 is an acrylic resin and the fine particle 16 is an epoxy resin fine particle, the resin 17 is a polycarbonate resin and the fine particle 16 is a silicon fine particle, the resin 17 is a polycarbonate resin and the fine particle 16 is an aluminum fine particle, the resin 17 is a polycarbonate resin and the fine particle 16 is a magnesium fine particle, the resin 17 is a polycarbonate resin and the fine particle 16 is a silicon oxide fine particle, the resin 17 is a polycarbonate resin and the fine particle 16 is an aluminum oxide fine particle, the resin 17 is a polycarbonate resin and the fine particle 16 is a magnesium oxide fine particle, the resin 17 is a polycarbonate resin and the fine particle 16 is an aluminum hydroxide fine particle, the resin 17 is a polycarbonate resin and the fine particle 16 is a magnesium carbonate fine particle, the resin 17 is a polycarbonate resin and the fine particle 16 is an acrylic resin fine particle, the resin 17 is a polycarbonate resin and the fine particle 16 is a styrene resin fine particle, the resin 17 is a polycarbonate resin and the fine particle 16 is a silicone resin fine particle, the resin 17 is a polycarbonate resin and the fine particle 16 is a urethane resin fine particle, the resin 17 is a polycarbonate resin and the fine particle 16 is a melamine resin fine particle, the resin 17 is a polycarbonate resin and the fine particle 16 is an epoxy resin fine particle, the resin 17 is polyethylene terephthalate and the fine particle 16 is a silicon fine particle, the resin 17 is polyethylene terephthalate and the fine particle 16 is an aluminum fine particle, the resin 17 is polyethylene terephthalate and the fine particle 16 is a magnesium fine particle, the resin 17 is polyethylene terephthalate and the fine particle 16 is a silicon oxide fine particle, the resin 17 is polyethylene terephthalate and the fine particle 16 is an aluminum oxide fine particle, the resin 17 is polyethylene terephthalate and the fine particle 16 is a magnesium oxide fine particle, the resin 17 is polyethylene terephthalate and the fine particle 16 is an aluminum hydroxide fine particle, the resin 17 is polyethylene terephthalate and the fine particle 16 is a magnesium carbonate fine particle, the resin 17 is polyethylene terephthalate and the fine particle 16 is an acrylic resin fine particle, the resin 17 is polyethylene terephthalate and the fine particle 16 is a styrene resin fine particle, the resin 17 is polyethylene terephthalate and the fine particle 16 is a silicone resin fine particle, the resin 17 is polyethylene terephthalate and the fine particle 16 is a urethane resin fine particle, the resin 17 is polyethylene terephthalate and the fine particle 16 is a melamine resin fine particle, or the resin 17 is polyethylene terephthalate and the fine particle 16 is an epoxy resin fine particle. Among those combinations of the resin 17 and the fine particle 16, from the viewpoint of having excellent heat resistance, dynamic properties, and molding processability of the light extraction film 10 for EL devices, the refractive index within the preferred range described above, and having excellent light extraction efficiency and the luminance in the normal direction of a surface light emitter and enhancing the function of a surface light emitter to suppress the emission angle dependence of the wavelength of emitted light, the following combinations are preferable; the resin 17 is an acrylic resin and the fine particle 16 is a silicon fine particle, the resin 17 is an acrylic resin and the fine particle 16 is an aluminum fine particle, the resin 17 is an acrylic resin and the fine particle 16 is a magnesium fine particle, the resin 17 is an acrylic resin and the fine particle 16 is a silicon oxide fine particle, the resin 17 is an acrylic resin and the fine particle 16 is an aluminum oxide fine particle, the resin 17 is an acrylic resin and the fine particle 16 is a magnesium oxide fine particle, the resin 17 is an acrylic resin and the fine particle 16 is an aluminum hydroxide fine particle, the resin 17 is an acrylic resin and the fine particle 16 is a magnesium carbonate fine particle, the resin 17 is an acrylic resin and the fine particle 16 is an acrylic resin fine particle, the resin 17 is an acrylic resin and the fine particle 16 is a styrene resin fine particle, the resin 17 is an acrylic resin and the fine particle 16 is a silicone resin fine particle, the resin 17 is an acrylic resin and the fine particle 16 is a urethane resin fine particle, the resin 17 is an acrylic resin and the fine particle 16 is a melamine resin fine particle, or the resin 17 is an acrylic resin and the fine particle 16 is an epoxy resin fine particle. The following combinations are more preferable; the resin 17 is an acrylic resin and the fine particle 16 is a silicon oxide fine particle, the resin 17 is an acrylic resin and the fine particle 16 is an aluminum oxide fine particle, the resin 17 is an acrylic resin and the fine particle 16 is an aluminum hydroxide fine particle, the resin 17 is an acrylic resin and the fine particle 16 is a magnesium carbonate fine particle, the resin 17 is an acrylic resin and the fine particle 16 is an acrylic resin fine particle, the resin 17 is an acrylic resin and the fine particle 16 is a styrene resin fine particle, the resin 17 is an acrylic resin and the fine particle 16 is a silicone resin fine particle, the resin 17 is an acrylic resin and the fine particle 16 is a urethane resin fine particle, the resin 17 is an acrylic resin and the fine particle 16 is a melamine resin fine particle, or the resin 17 is an acrylic resin and the fine particle 16 is an epoxy resin fine particle. The following combination is even more preferable; the resin 17 is an acrylic resin and the fine particle 16 is a silicone resin fine particle.

The fine particle 16 may be localized in the resin 17. Alternatively, it may be almost evenly dispersed in the resin 17. However, from the viewpoint of having excellent productivity of the light extraction film 10 for EL devices, it is preferable that the fine particle 16 be almost evenly dispersed in the resin 17.

The convex-concave structure 12 may contain a component other than the resin 17 or the fine particle 16 within a range in which the performance is not inhibited.

Examples of the other component include various additives such as a releasing agent, an anti-static agent, a leveling agent, an anti-fouling performance enhancer, a dispersion stabilizer, or a viscosity modifier.

A content of the other component in the convex-concave structure 12 is preferably 3% by mass or less, more preferably 2% by mass or less, and still more preferably 1% by mass or less. When the content of other component in the convex-concave structure 12 is 3% by mass or less, a decrease in performance of the light extraction film 10 for EL devices can be inhibited.

To enhance the handlability of the light extraction film 10 for EL devices by protecting the spherical protrusions 15, the light extraction film 10 for EL devices of the invention may have a protection film formed on a surface having the spherical protrusions 15. The protection film may be peeled from the light extraction film 10 for EL devices at the time of using the light extraction film 10 for EL devices.

As for the protection film, a known protection film or the like can be exemplified.

(Base Material 14)

To maintain own shape, the light extraction film 10 for EL devices may have the base material 14 on a side opposite to the convex-concave structure 12 as illustrated in FIG. 1.

As described below, at the time of producing the convex-concave structure layer 11, an active energy ray can be irradiated onto the active energy ray curable composition via the base material 14. In this regard, from the viewpoint of having an excellent curing property of the active energy ray curable composition, a base material allowing transmission of the active energy ray is preferred as the base material 14.

Examples of a material of the base material 14 include an acrylic resin; a polycarbonate resin; a polyester resin such as polyethylene terephthalate, polybutylene terephthalate, or polyethylene naphthalate; a styrene resin such as polystyrene or an ABS resin; a vinyl chloride resin; a cellulose resin such as diacetyl cellulose or triacetyl cellulose; an imide resin such as polyimide or polyimide amide; glass; and a metal. Among those materials of the base material 14, from the viewpoint of having excellent flexibility and an excellent light transmitting property for an active energy ray, an acrylic resin, a polycarbonate resin, a polyester resin, a styrene resin, a cellulose resin, and an imide resin are preferable. An acrylic resin, a polycarbonate resin, a polyester resin, and an imide resin are more preferable.

The thickness of the base material 14 is, from the viewpoint of having an excellent curing property of the active energy ray curable composition, preferably 10 to 1,000 μm, more preferably 20 to 500 μm, and still more preferably 25 to 300 μm.

To improve the adhesion property between the base layer 13 and the base material 14, an adhesion facilitating treatment may be performed on a surface of the base material 14, if necessary.

Examples of a method for the adhesion facilitating treatment include a method of forming an easy adhesion layer consisting of a polyester resin, an acrylic resin, a urethane resin, or the like on a surface of the base material 14 and a method of roughening a surface of the base material 14.

In addition to the adhesion facilitating treatment, a surface treatment of the base material 14 such as anti-static, anti-reflection, or anti-adhesion between base materials may be performed, if necessary.

In the light extraction film 10 for EL devices of the invention, the adhesion layer 21 for adhering to the EL device 30 (see, FIG. 6) may be formed on a surface opposite to the convex-concave structure 12. When the light extraction film 10 for EL devices has the base material 14, as illustrated in FIG. 1, the adhesion layer 21 may be formed on a bottom surface opposite to the top surface, which is the surface of the base material 14 added with the convex-concave structure layer 11.

Examples of the adhesion layer 21 include a layer coated with known adhesives.

To enhance the handlability of the light extraction film 10 for EL devices, the protection film 22 may be formed on a surface of the adhesion layer 21 (bottom surface in FIG. 1) as illustrated in FIG. 1. When the light extraction film 10 for EL devices is attached onto a surface of the EL device 30, the protection film 22 is removed from the light extraction film 10 for EL devices to expose the adhesion layer 21.

Examples of the protection film 22 include a known protection film.

When a surface light emitter is produced by attaching the light extraction film 10 for EL devices of the invention to the EL device 30, the luminance in the normal direction of the surface light emitter after the attachment is preferably 150% or more compared to the luminance in the normal direction of the EL device 30 before the attachment, and more preferably, is 160% or more.

(Method for Producing Light Extraction Film 10 for EL Devices)

Figure 5:
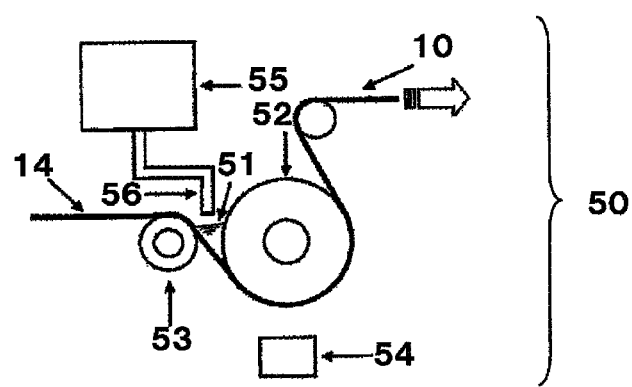
FIG. 5 is a schematic diagram illustrating an exemplary method for producing the light extraction film for EL devices of the invention.

As a method for producing the light extraction film 10 for EL devices of the invention, a method using the production device 50 illustrated in FIG. 5 can be exemplified.

Hereinbelow, the method for producing the light extraction film 10 for EL devices using the device 50 illustrated in FIG. 5 is described, but the method for producing the light extraction film for EL devices of the invention is not limited to the production method using the device 50 illustrated in FIG. 5.

The active energy ray curable resin composition, the fine particle 16, and other components that are used as needed for constituting the light extraction film 10 for EL devices are mixed in a desired mixing amount and the obtained mixture 51 is added in advance to the storage tank 55.

The base material 14 is introduced between the roll mold 52 of a column shape for forming the spherical protrusions 15 and the nip roll 53 made of rubber. In this state, the mixture 51 is supplied between the rotating roll mold 52 and the running base material 14 from the tank 55 via the pipe 56, which has a nozzle added on the tip.

The mixture 51 sandwiched between the rotating roll mold 52 and the running base material 14 is cured by an active energy ray that is irradiated from the device 54 for irradiating an active energy ray via the base material 14. By releasing the obtained cured product from the roll mold 52, the light extraction film 10 for EL devices having the base material 14 is obtained.

Viscosity of the mixture 51 is, from the viewpoint of having excellent handlability during production of the light extraction film 10 for EL devices, preferably 10 to 3000 mPa·s, more preferably 20 to 2500 mPa·s, and still more preferably 30 to 2000 mPa·s.

The mixture 51 may contain a component other than the active energy ray curable resin composition for constituting the resin 17 and the fine particle 16 within a range in which the performance of the light extraction film 10 for EL devices is not inhibited.

Examples of the other component include various additives such as a releasing agent, an anti-static agent, a leveling agent, an anti-fouling performance enhancer, a dispersion stabilizer, or a viscosity modifier.

Examples of the roll mold 52 include a metal mold such as aluminum, yellow copper, or steel; a resin mold such as a silicone resin, a urethane resin, an epoxy resin, an ABS resin, a fluororesin, or a polymethylpentene resin; a plated resin mold; and a mold produced with a material in which various metal powders are mixed with a resin. Among those roll mold 52, from the viewpoint of having excellent heat resistance or mechanical strength, or suitability for continuous production, a metal mold is preferable. Specifically, the metal mold is preferred in many aspects that it is resistant to heat generated by polymerization, hardly deformed, and resistant to scratches and it allows temperature control and is suitable for fine molding or the like.

On the roll mold 52, it is necessary to form a transfer surface having depressions for forming the spherical protrusions 15 of the light extraction film 10 for EL devices.

Examples of a method for producing a transfer surface include cutting by a diamond bite and etching described in the pamphlet of WO 2008/069324 A. Among those methods for producing a transfer surface, from the viewpoint of easy forming of depressions having a curvature, the etching described in the pamphlet of WO 2008/069324 A is preferable.

Further, as a method for producing a transfer surface, a method of producing the roll mold 52 of a column shape by winding a metal foil, which is produced from a master mold having protrusions with reversed depressions of a transfer surface based on electroforming, on a roll core member can be used.

On an inside or an outside of the roll mold 52, a heat source facility such as a seize heater or a hot water jacket may be installed, if necessary, to maintain the surface temperature.

Examples of the active energy ray generated from the device 54 for irradiating an active energy ray include ultraviolet rays, electron beams, X rays, infrared rays, and visible rays. Among those active energy rays, from the viewpoint of having an excellent curing property of an active energy ray curable composition and suppressing deterioration of the light extraction film 10 for EL devices, ultraviolet rays and electron beams are preferable. Ultraviolet rays are more preferable.

Examples of the source for emitting the active energy ray of the device 54 for irradiating an active energy ray include a chemical lamp, a low pressure mercury lamp, a high pressure mercury lamp, a metal halide lamp, an electrodeless ultraviolet lamp, a visible light halogen lamp, and a xenon lamp.

The accumulated light quantity of the active energy ray from the device 54 for irradiating an active energy ray is, from the viewpoint of having an excellent curing property of the active energy ray curable composition and suppressing deterioration of the light extraction film 10 for EL devices, preferably 0.01 to 10 $J/cm^2$ and more preferably 0.5 to 8 $J/cm^2$.

Curing of the active energy ray curable composition by the device 54 for irradiating an active energy ray may be performed by curing of the active energy ray curable composition all at once with one irradiation of the active energy ray or by gradual curing of the active energy ray curable composition in divided portions with several irradiations of the active energy ray. However, from the viewpoint of having excellent productivity of the light extraction film for EL devices, it is preferable that the active energy ray curable composition be cured all at once with one irradiation of the active energy ray.

Meanwhile, even when a plurality of the devices 54 for irradiating an active energy ray are used, as long as the active energy ray curable composition is simultaneously irradiated with the active energy ray, it is substantially taken as one irradiation of the active energy ray.

On an inside or an outside of the tank 55, a heat source facility such as a seize heater or a hot water jacket may be installed, if necessary, to maintain the storage temperature of the mixture 51.

(Surface Light Emitter)

The surface light emitter of the invention includes the light extraction film 10 for EL devices of the invention and an EL device as a light emitting source.

Figure 6:
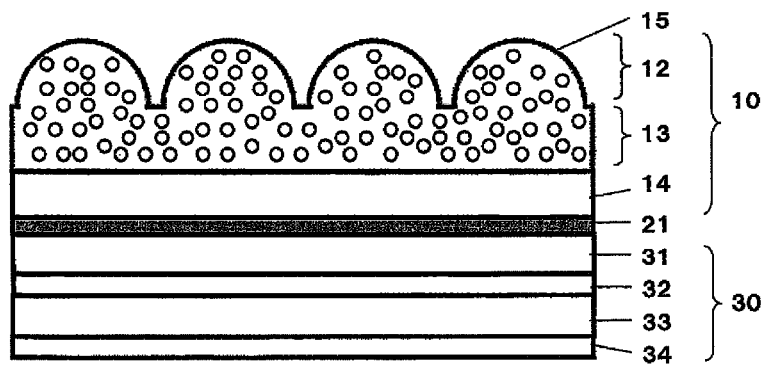
FIG. 6 is a schematic diagram illustrating an exemplary surface light emitter of the invention.

As for the surface light emitter of the invention, the surface light emitter illustrated in FIG. 6 can be exemplified.

Hereinbelow, the surface light emitter illustrated in FIG. 6 is described but the surface light emitter of the invention is not limited to the surface light emitter of FIG. 6.

The surface light emitter of FIG. 6 is obtained by attaching the light extraction film 10 for EL devices of the invention, which is as illustrated in FIG. 1, on a light generating surface (light emitting surface) of the EL device 30 as a light emitting source (with the proviso that, the protection film 22 is removed by peeling). The EL device 30 is obtained by laminating in order the glass substrate 31, the positive electrode 32, the light emitting layer 33, and the negative electrode 34. The light extraction film 10 for EL devices adheres onto a surface of the glass substrate 31 of the EL device 30 based on the adhesive force of the adhesion layer 21.

The surface light emitter obtained by attaching the light extraction film 10 for EL devices on the EL device 30 has excellent light extraction efficiency and has the enhanced function of suppressing the emission angle dependence of the wavelength of emitted light.

EXAMPLES

Hereinbelow, the invention is specifically described by way of Examples, but the invention is not limited to those Examples.

Meanwhile, the "parts" and "%" in Examples indicate "parts by mass" and "% by mass", respectively.

(Observation of Surface and Cross Section of Light Extraction Film for EL Devices)

A surface and a cross section of the light extraction film for EL devices obtained from Examples were observed using a scanning-type electron microscope (SEM) (model name "S-4300-SE/N", manufactured by Hitachi High-Technologies Corporation).

Meanwhile, for measurement of the cross section of the light extraction film for EL devices, the light extraction film for EL devices obtained from Examples was cut using a razor blade so as to cross the top point of the spherical protrusions and to be perpendicular to the bottom portion of the spherical protrusions.

(Measurement of Light Extraction Efficiency)

On the surface light emitter obtained from each of Example, Comparative Example, Reference Example, a 0.1 mm-thick light blocking sheet having holes with a diameter of 10 mm was placed and it was then placed on the sample opening part of an integrating sphere (manufactured by Labsphere, Inc., size: 6 inch). In the same state, the light emitted from the 10 mm-diameter hole of the light blocking sheet after turning on the light by allowing 10 mA current to flow into the EL device was measured by using a spectroscopic measurement device (spectrophotometer: model name "PMA-12", (manufactured by Hamamatsu Photonics K.K.), software: software name "Basic software for PMA, U6039-01 ver. 3.3.1"). By performing calibration based on a standard visibility curve, the photon number of the surface light emitter was calculated.

When the photon number of the surface light emitter obtained from Reference Example is taken as a standard, the ratio (%) of the photon number of the surface light emitter obtained from Example•Comparative Example is obtained as light extraction efficiency.

(Measurement of Luminance in Normal Direction)

On the surface light emitter obtained from Example•Comparative Example•Reference Example, a 0.1 mm-thick light blocking sheet having holes with a diameter of 10 mm was placed. In the same state, the light emitted from the 10 mm-diameter hole of the light blocking sheet after turning on the light by allowing 10 mA current to flow into the EL device was measured in the normal direction of the surface light emitter by using a luminance meter (model name "BM-7", manufactured by TOPCON Corporation) to obtain the luminance of the surface light emitter.

When the luminance of the surface light emitter obtained from Reference Example is taken as a standard, the ratio (%) of the luminance of the surface light emitter obtained from Example•Comparative Example is obtained as luminance in the normal direction.

(Measurement of Amount of Change in Chromaticities)

On the surface light emitter obtained from Example•Comparative Example Reference Example, a 0.1 mm-thick light blocking sheet having holes with a diameter of 10 mm was placed. In the same state, the light emitted from the 10 mm-diameter hole of the light blocking sheet after turning on the light by allowing 10 mA current to flow into the EL device was measured by using a luminance meter (model name "BM-7", manufactured by TOPCON Corporation) in the normal direction (0°) of the surface light emitter, in the direction tilted at 10° from the normal direction of the surface light emitter, in the direction tilted at 20° from the normal direction of the surface light emitter, in the direction tilted at 30° from the normal direction of the surface light emitter, in the direction tilted at 40° from the normal direction of the surface light emitter, in the direction tilted at 50° from the normal direction of the surface light emitter, in the direction tilted at 60° from the normal direction of the surface light emitter, in the direction tilted at 70° from the normal direction of the surface light emitter, in the direction tilted at 75° from the normal direction of the surface light emitter, or in the direction tilted at 80° from the normal direction of the surface light emitter to measure chromaticities x, y of xy color system. Values of x at each angle and an average value of x were plotted against the horizontal axis and values of y at each angle and an average value of y were plotted against the vertical axis. Then, the distance from the plotted points of the average values of x and y to the plotted points of x and y values at each angle were calculated and the value at the longest distance was taken as the amount of change in chromaticities.

Meanwhile, a smaller amount of change in chromaticities means better suppression of light emission angle dependence of the wavelength of emitted light of the surface light emitter.

(Materials)

Active energy ray curable composition A: the active energy ray curable composition which is produced in Example 1 to be described below (refractive index of a cured product: 1.52)

Active energy ray curable composition B: the active energy ray curable composition which is produced in Example 9 to be described below (refractive index of a cured product: 1.58)

Active energy ray curable composition C: the active energy ray curable composition which is produced in Example 10 to be described below (refractive index of a cured product: 1.58)

Active energy ray curable composition D: the active energy ray curable composition which is produced in Example 11 to be described below (refractive index of a cured product: 1.59)

Active energy ray curable composition E: the active energy ray curable composition which is produced in Example 12 to be described below (refractive index of a cured product: 1.60)

Active energy ray curable composition F: the active energy ray curable composition which is produced in Example 13 to be described below (refractive index of a cured product: 1.61)

Fine particle A: Silicone resin spherical fine particle (trade name of "Tospearl 120", manufactured by Momentive Performance Materials Inc., refractive index: 1.42, volume average particle diameter: 2 μm)

Fine particle B: Silicone resin spherical fine particle (trade name of "XC99A8808", manufactured by Momentive Performance Materials Inc., refractive index: 1.42, volume average particle diameter: 0.7 μm)

Fine particle C: Silicone resin spherical fine particle (trade name of "Tospearl 2000B", manufactured by Momentive Performance Materials Inc., refractive index: 1.42, volume average particle diameter: 6 μm)

Fine particle D: Styrene resin spherical fine particle (trade name of "XX109B", manufactured by Sekisui Chemical Co., Ltd., refractive index: 1.59, volume average particle diameter: 2 μm)

Fine particle E: Melamine resin spherical fine particle (trade name of "Optobeads 2000M", manufactured by Nissan Chemical Industries, Ltd., refractive index: 1.65, volume average particle diameter: 2 μm)

Fine particle F: Silicone resin spherical fine particle (trade name of "Tospearl 3120", manufactured by Momentive Performance Materials Inc., refractive index: 1.42, volume average particle diameter: 12 μm)

EL device A: EL device in which the light extraction film for EL devices on a surface of light emitting surface side of Symfos OLED-010K (manufactured by Konica Minolta, Inc., white OLED device) is removed.

EL device B: EL device in which the light extraction film for EL devices on a surface of light emitting surface side of OLED_Panel NZIP0S0808300 (manufactured by Panasonic Corporation, white OLED device) is removed.

Reference Example 1

EL device A itself was used as a surface light emitter.

Reference Example 2

EL device B itself was used as a surface light emitter.

Example 1

Production of Active Energy Ray Curable Composition A

To a glass flask, 117.6 g (0.7 mol) of hexamethylene diisocyanate and 151.2 g (0.3 mol) of isocyanurate-type hexamethylene diisocyanate trimer as a diisocyanate compound, 128.7 g (0.99 mol) of 2-hydroxypropylacrylate and 693 g (1.54 mol) of pentaerythritol triacrylate as a hydroxyl group-containing (meth)acrylate, 22.1 g of di-n-butyltin dilaurate as a catalyst, and 0.55 g of hydroquinone monomethyl ether as a polymerization inhibitor were added. After raising the temperature to 75° C., the stirring was continued while maintaining 75° C. and the reaction was allowed to occur until the concentration of the remaining isocyanate compound in the flask is 0.1 mol/L or less. As a result of cooling to room temperature, urethane polyfunctional acrylate was obtained.

35 parts of the obtained urethane polyfunctional acrylate, 20 parts of dimethacrylate represented by the following chemical formula (1) (trade name of "Acryester PBOM", manufactured by Mitsubishi Rayon Co., Ltd.), 40 parts of dimethacrylate represented by the following chemical formula (2) (trade name of "New Frontier BPEM-10", manufactured by Daiichi Kogyo Seiyaku Co., Ltd.), 5 parts of acrylate represented by the following chemical formula (3) (trade name of "New Frontier PHE", manufactured by Daiichi Kogyo Seiyaku Co., Ltd.), and 1.2 parts of 1-hydroxycyclohexyl phenyl ketone (trade name of "Irgacure 184", manufactured by Ciba Specialty Chemicals Corp.) were admixed with one another to obtain the active energy ray curable composition A.

[Chemical Formula 1]

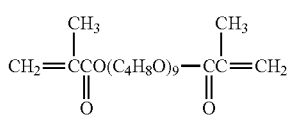
(1)

[Chemical Formula 2]

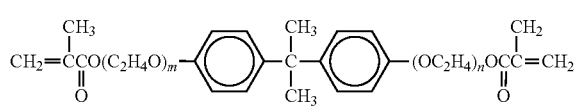
(2)

$m + n = 10$

[Chemical Formula 3]

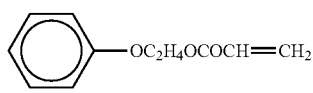
(3)

(Production of Mixture)

By mixing the active energy ray curable composition A and the fine particle A, a mixture in which the active energy ray curable composition A is 70% and the particle A is 30% was obtained.

(Production of Roll Mold)

On an outer peripheral surface of a steel roll with the outer diameter of 200 mm and axial direction length of 320 mm, copper plating with the thickness of 200 μm and Vickers hardness of 230 Hv was performed. By coating the surface of copper plating layer with a sensitizer and performing laser light exposure, development, and etching, a mold having a transfer part formed therein, in which hemispherical depressions (diameter of 50 μm and depth of 25 μm) are arranged in a hexagonal manner at the minimum interval of 5 μm, was obtained. On the surface of the obtained mold, chrome plating was performed to give an anti-corrosion property and durability, and thus a roll mold was obtained.

(Production of Light Extraction Film for EL Devices)

On the obtained roll mold, the obtained mixture was coated and, after disposing a polyethylene terephthalate base material (trade name of "Diafoil T910E125", manufactured by Mitsubishi Plastics, Inc.) with the thickness of 125 μm, the mixture was evenly stretched using a nip roll such that the base layer has the thickness of 20 μm. After that, ultraviolet rays were irradiated from the top of the base material to cure the mixture sandwiched between the roll mold and base material. By removing the obtained assembly of the cured product and base material from the roll mold, a light extraction film for EL devices having a base material was obtained.

Figure 7:
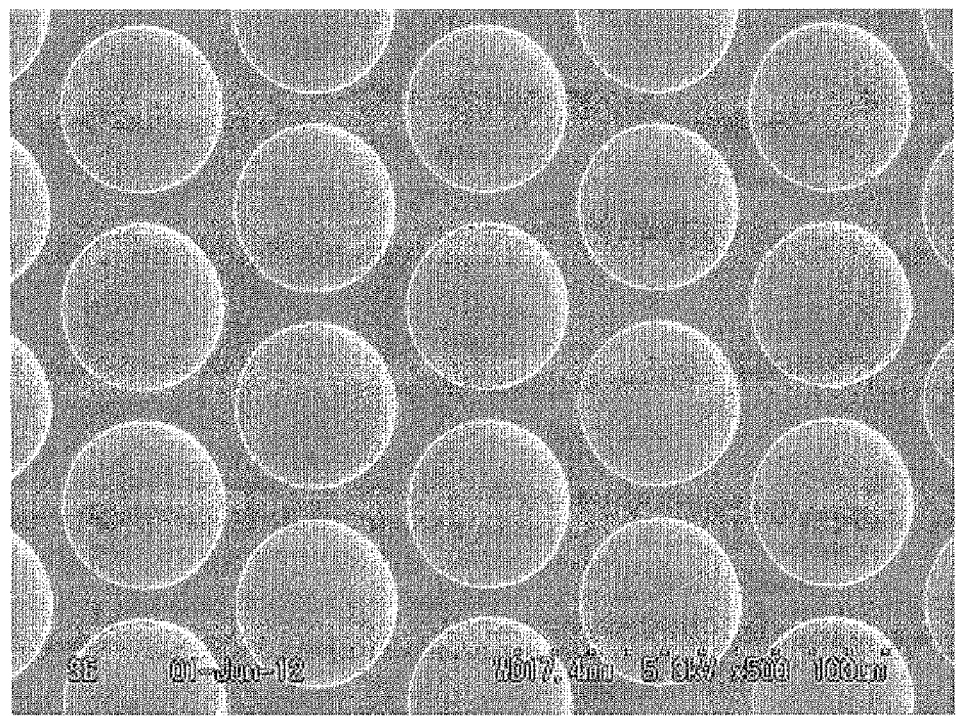
FIG. 7 is a photographic image of the surface of the light extraction film for EL devices having a convex-concave structure, which has been produced in Example 1, as taken by a scanning-type microscope.
Figure 8:
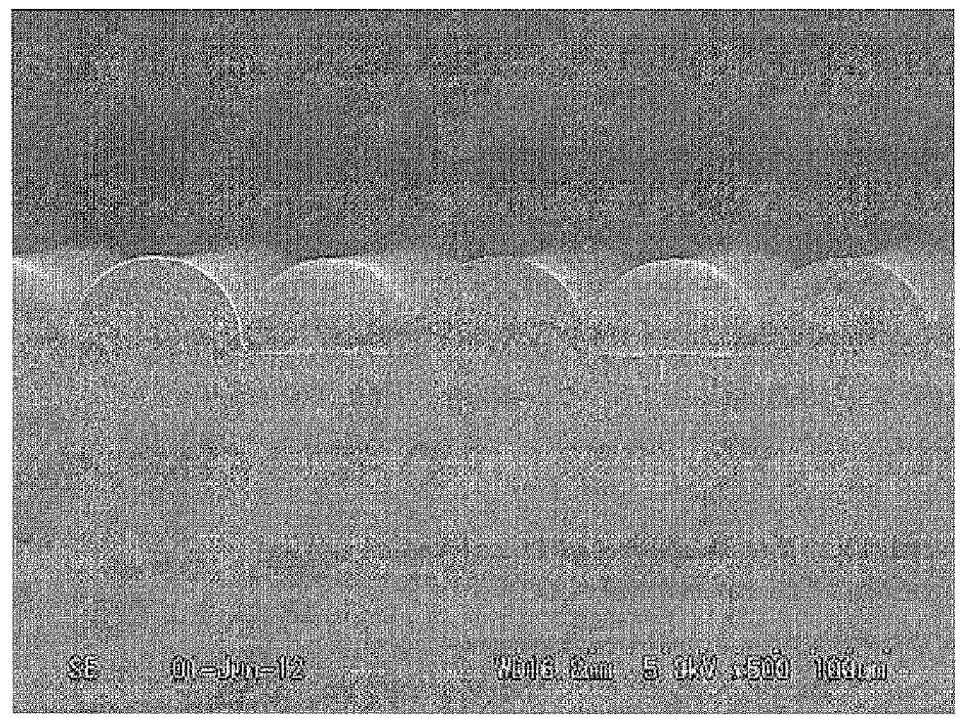
FIG. 8 is a photographic image of the cross section of the light extraction film for EL devices, which has been produced in Example 1, as taken by a scanning-type microscope.

The photographic images of the obtained light extraction film for EL devices as obtained by a scanning-type electron microscope are illustrated in FIG. 7 and FIG. 8. The convex-concave structure of the light extraction film for EL devices, which has been calculated from the photographic images, has the average maximum diameter $A_{ave}$ of 49.5 μm and the average height $B_{ave}$ of 25.9 μm, in which protrusions (spherical protrusions) with a spherical segment shape roughly corresponding to the size of the depression of the roll mold are arranged. The spherical protrusions were arranged according to hexagonal arrangement at the minimum interval of 5 μm, while they roughly correspond to the depressions of the roll mold. The ratio of total area of the bottom portion of the spherical protrusions to the area of the light extraction film for EL devices was 75%.

The $A_{ave}/P$ value of the light extraction film for EL devices was 25.

(Production of Surface Light Emitter)

On the light emitting side of the EL device A, Cargill standard refractive index liquid (refractive index of 1.52, manufactured by Moritex Corporation) was coated as an adhesion layer. According to optical adhesion of base material surface of the obtained light extraction film for EL devices having a base material, a surface light emitter was obtained. Light extraction efficiency, luminance in the normal direction, and amount of change in chromaticities of the obtained surface light emitter are shown in Table 1.

Examples 2 and 3 and Comparative Examples 1 to 3

A surface light emitter was obtained for Examples 2 and 3 and Comparative Examples 1 and 2 by performing the same operations as Example 1 except that the composition of the mixture is modified as described in Table 1. Light extraction efficiency, luminance in the normal direction, and amount of change in chromaticities of the obtained surface light emitter are shown in Table 1.

The $A_{ave}/P$ value of the light extraction film for EL devices was 25 for each of Examples 2 and 3 and Comparative Example 2.

Meanwhile, since the viscosity of the mixture was high in Comparative Example 3, it was not possible to produce a light extraction film for EL devices, and therefore no surface light emitter was obtained.

TABLE 1

| | Mixture | | | | | | Light extraction film for EL devices | | | Evaluation result of surface light emitter | | |
|---|---|---|---|---|---|---|---|---|---|---|---|---|
| | Curable composition | | | Fine particle | | | | | | | | |
| | Type | Content (%) | Refractive index of cured product | Type | Content (%) | Volume average particle diameter (μm) | Refractive index | Shape of protrusions | Thickness of base layer (μm) | EL device Type | Light extraction efficiency (%) | Luminance in normal direction (%) | Amount of change in chromaticities |
| Reference Example 1 | — | — | — | — | — | — | — | — | — | A | 100 | 100 | 0.0192 |
| Example 1 | A | 70 | 1.52 | A | 30 | 2 | 1.42 | Spherical segment | 20 | A | 177.0 | 166.0 | 0.0029 |
| Example 2 | A | 77 | 1.52 | A | 23 | 2 | 1.42 | Spherical segment | 20 | A | 177.3 | 168.0 | 0.0036 |
| Example 3 | A | 60 | 1.52 | A | 40 | 2 | 1.42 | Spherical segment | 20 | A | 173.4 | 170.0 | 0.0016 |

TABLE 1-continued

| | Mixture | | | | | | Light extraction film for EL devices | | | Evaluation result of surface light emitter | | |
|---|---|---|---|---|---|---|---|---|---|---|---|---|
| | Curable composition | | | Fine particle Volume | | | | | | | | |
| | Type | Content (%) | Refractive index of cured product | Type | Content (%) | average particle diameter (μm) | Refractive index | Shape of protrusions | Thickness of base layer (μm) | EL device Type | Light extraction efficiency (%) | Luminance in normal direction (%) | Amount of change in chromaticities |
| Comparative Example 1 | A | 100 | 1.52 | — | — | — | — | Spherical segment | 20 | A | 177.9 | 165.0 | 0.0120 |
| Comparative Example 2 | A | 90 | 1.52 | A | 10 | 2 | 1.42 | Spherical segment | 20 | A | 177.2 | 165.0 | 0.0051 |
| Comparative Example 3 | A | 40 | 1.52 | A | 60 | 2 | 1.42 | — | — | — | — | — | — |

The surface light emitter having the light extraction film for EL devices of the invention, which has been obtained from Examples 1 to 3, exhibited excellent light extraction efficiency or luminance in the normal direction and is capable of sufficiently suppressing the emission angle dependence of the wavelength of emitted light. Meanwhile, the surface light emitter having a light extraction film for EL devices which has been obtained from Comparative Examples 1 and 2, in which the content of the fine particle is not within the range of the invention, exhibited no sufficiently suppressed emission angle dependence of the wavelength of emitted light.

Example 4

(Production of Flat Mold)

The surface of nickel of flat metal plating obtained by performing non-electrolytic nickel plating on a surface of stainless steel was subjected to a polishing processing by using an ultrafine flat processing machine equipped with a single crystal diamond bite to obtain a smooth flat surface. Next, an electromotive spindle was added to a tool rest of the ultrafine flat processing machine and a ball-end mill was equipped to the tip of the electromotive spindle, which was then rotated at 20000 rpm. The ultrafine flat processing machine was subjected to NC control and, by cutting the ball-end mill on its smooth flat surface, a mold having a transfer part formed therein, in which depressions with elliptical hemisphere shape (diameter of 30 μm and depth of 18 μm, ellipsoid spherical segment shape) are arranged in a hexagonal manner at the minimum interval of 1 μm, was obtained. On the surface of the obtained mold, chrome plating was performed to give an anti-corrosion property and durability, and thus a flat mold was obtained.

A surface light emitter was obtained by performing the same operations as Example 1 except that the flat mold obtained above is used. Light extraction efficiency, luminance in the normal direction, and amount of change in chromaticities of the obtained surface light emitter are shown in Table 2.

Figure 9:
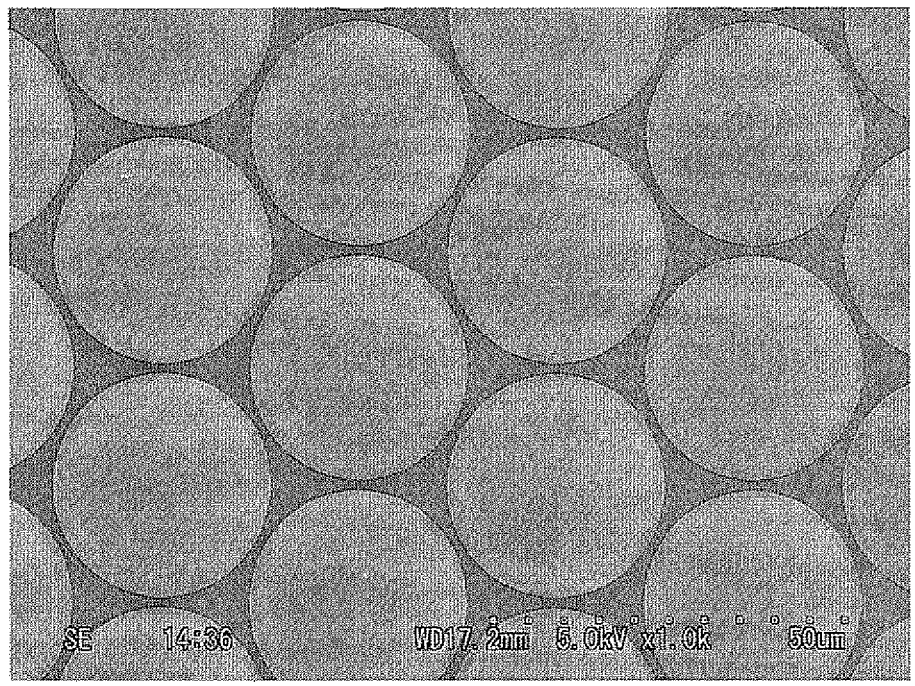
FIG. 9 is a photographic image of the surface of the light extraction film for EL devices having a convex-concave structure, which has been produced in Example 4, as taken by a scanning-type microscope.
Figure 10:
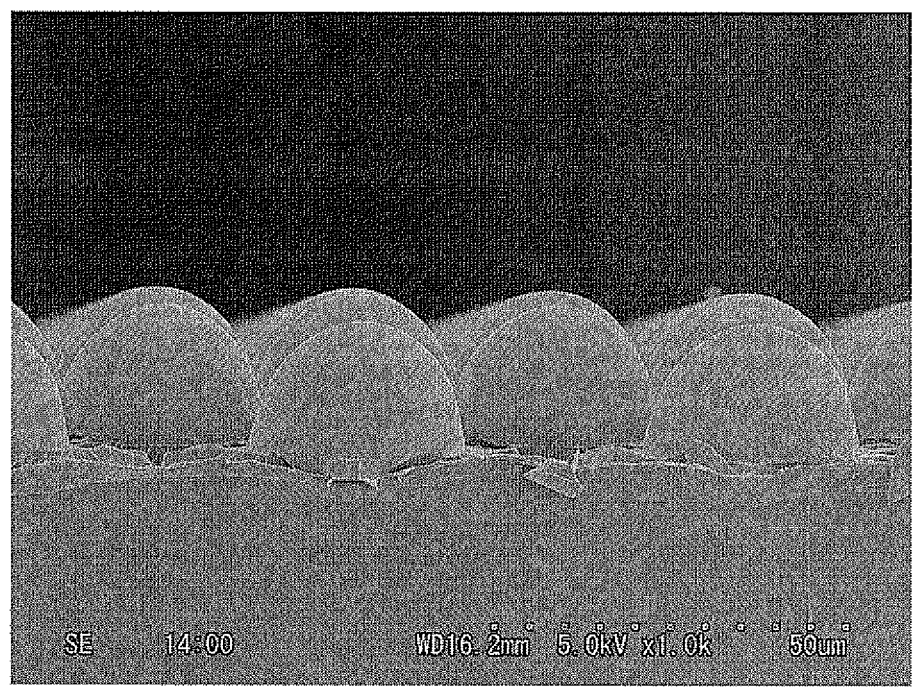
FIG. 10 is a photographic image of the cross section of the light extraction film for EL devices, which has been produced in Example 4, as taken by a scanning-type microscope.

The photographic images of the obtained light extraction film for EL devices as obtained by a scanning-type electron microscope are illustrated in FIG. 9 and FIG. 10. The convex-concave structure of the light extraction film for EL devices, which has been calculated from the photographic images, has the average maximum diameter $A_{ave}$ of 30.2 μm and the average height $B_{ave}$ of 18.1 μm, in which protrusions (spherical protrusions) with a spherical segment shape roughly corresponding to the size of the depression of the flat mold are arranged. The spherical protrusions were arranged according to hexagonal arrangement at the minimum interval of 1.4 μm, while they roughly correspond to the depressions of the flat mold. The ratio of total area of the bottom portion of the spherical protrusions compared to the area of the light extraction film for EL devices was 83%.

The $A_{ave}/P$ value of the light extraction film for EL devices was 15.

Comparative Example 4

A surface light emitter was obtained by performing the same operations as Example 4 except that, as a flat mold, a mold having a transfer part formed therein, in which quadrangular pyramidal depressions with the vertical angle of 120° are included, and a rectangular shape with one side length of 50 μm is used. Light extraction efficiency, luminance in the normal direction, and amount of change in chromaticities of the obtained surface light emitter are shown in Table 2.

TABLE 2

| | Mixture | | | | | | Light extraction film for EL devices | | | Evaluation result of surface light emitter | | |
|---|---|---|---|---|---|---|---|---|---|---|---|---|
| | Curable composition | | | Fine particle Volume | | | | | | | | |
| | Type | Content (%) | Refractive index of cured product | Type | Content (%) | average particle diameter (μm) | Refractive index | Shape of protrusions | Thickness of base layer (μm) | EL device Type | Light extraction efficiency (%) | Luminance in normal direction (%) | Amount of change in chromaticities |
| Reference Example 1 | — | — | — | — | — | — | — | — | — | A | 100 | 100 | 0.0192 |
| Example 1 | A | 70 | 1.52 | A | 30 | 2 | 1.42 | Spherical segment | 20 | A | 177.0 | 166.0 | 0.0029 |

TABLE 2-continued

| | Mixture | | | | | | | Light extraction film for EL devices | | | Evaluation result of surface light emitter | | |
|---|---|---|---|---|---|---|---|---|---|---|---|---|---|
| | Curable composition | | | Fine particle | | | | | | | | | |
| | | | | | | Volume | | | | | | | |
| | Type | Content (%) | Refractive index of cured product | Type | Content (%) | average particle diameter (μm) | Refractive index | Shape of protrusions | Thickness of base layer (μm) | EL device Type | Light extraction efficiency (%) | Luminance in normal direction (%) | Amount of change in chromaticities |
| Example 4 | A | 70 | 1.52 | A | 30 | 2 | 1.42 | Ellipsoid spherical segment | 20 | A | 180.1 | 172.0 | 0.0030 |
| Comparative Example 4 | A | 70 | 1.52 | A | 30 | 2 | 1.42 | Quadrangular pyramid | 20 | A | 171.2 | 133.0 | 0.0031 |

The surface light emitter having the light extraction film for EL devices of the invention, which has been obtained from Examples 1 and 4, exhibited excellent light extraction efficiency or luminance in the normal direction and is capable of sufficiently suppressing the emission angle dependence of the wavelength of emitted light.

Meanwhile, the surface light emitter having a light extraction film for EL devices, which has been obtained from Comparative Example 4, in which the shape of the convex-concave structure is not within the range of the invention, exhibited poor luminance in the normal direction.

Examples 5 to 8

A surface light emitter was obtained by performing the same operations as Example 1 except that the composition of the mixture is modified as described in Table 3. Light extraction efficiency, luminance in the normal direction, and amount of change in chromaticities of the obtained surface light emitter are shown in Table 3.

The $A_{ave}/P$ value of the light extraction film for EL devices was 8 to 71 for Examples 5 to 8.

Example 9

(Production of Active Energy Ray Curable Composition B)

100 parts of urethane polyfunctional acrylate (trade name of "GX8830A", manufactured by Daiichi Kogyo Seiyaku Co., Ltd.) and 1.2 parts of 1-hydroxycyclohexyl phenyl ketone (trade name of "Irgacure 184", manufactured by Ciba Specialty Chemicals Corp.) were admixed with each other to obtain the active energy ray curable composition B.

A surface light emitter was obtained by performing the same operations as Example 1 except that the type of the active energy ray curable composition of the mixture is modified to the active energy ray curable composition B. Light extraction efficiency, luminance in the normal direction, and amount of change in chromaticities of the obtained surface light emitter are shown in Table 3.

The $A_{ave}/P$ value of the light extraction film for EL devices was 25.

Example 10

(Production of Active Energy Ray Curable Composition C)

40 parts of fluorenediacrylate (trade name of "EA-0200", manufactured by Osaka Gas Chemical Co., Ltd.), 20 parts of dimethacrylate represented by the chemical formula (1) (trade name of "Acryester PBOM", manufactured by Mitsubishi Rayon Co., Ltd.), 20 parts of ethoxybisphenol A diacrylate (trade name of "ABE-300", manufactured by Shin Nakamura Chemical Co., Ltd.), 20 parts of ethoxyphenylphenol acrylate (trade name of "A-LEN-10", manufactured by Shin Nakamura Chemical Co., Ltd.), and 1.6 parts of 1-hydroxycyclohexyl phenyl ketone (trade name of "Irgacure 184", manufactured by Ciba Specialty Chemicals Corp.) were admixed with one another to obtain the active energy ray curable composition C.

A surface light emitter was obtained by performing the same operations as Example 1 except that the type of the active energy ray curable composition of the mixture is modified to the active energy ray curable composition C. Light extraction efficiency, luminance in the normal direction, and amount of change in chromaticities of the obtained surface light emitter are shown in Table 3.

The $A_{ave}/P$ value of the light extraction film for EL devices was 25.

Example 11

(Production of Active Energy Ray Curable Composition D)

40 parts of fluorenediacrylate (trade name of "EA-0200", manufactured by Osaka Gas Chemical Co., Ltd.), 20 parts of dimethacrylate represented by the chemical formula (1) (trade name of "Acryester PBOM", manufactured by Mitsubishi Rayon Co., Ltd.), 40 parts of ethoxyphenylphenol acrylate (trade name of "A-LEN-10", manufactured by Shin Nakamura Chemical Co., Ltd.), and 1.6 parts of 1-hydroxycyclohexyl phenyl ketone (trade name of "Irgacure 184", manufactured by Ciba Specialty Chemicals Corp.) were admixed with one another to obtain the active energy ray curable composition D.

A surface light emitter was obtained by performing the same operations as Example 1 except that the type of the active energy ray curable composition of the mixture is modified to the active energy ray curable composition D. Light extraction efficiency, luminance in the normal direction, and amount of change in chromaticities of the obtained surface light emitter are shown in Table 3.

The $A_{ave}/P$ value of the light extraction film for EL devices was 25.

Example 12

(Production of Active Energy Ray Curable Composition E)

50 parts of fluorenediacrylate (trade name of "EA-0200", manufactured by Osaka Gas Chemical Co., Ltd.), 20 parts of ethoxybisphenol A dimethacrylate (trade name of "BPE-1700N", manufactured by Shin Nakamura Chemical Co., Ltd.), 30 parts of ethoxyphenylphenol acrylate (trade name of "A-LEN-10", manufactured by Shin Nakamura Chemical Co., Ltd.), and 1.6 parts of 1-hydroxycyclohexyl phenyl ketone (trade name of "Irgacure 184", manufactured by Ciba Specialty Chemicals Corp.) were admixed with one another to obtain the active energy ray curable composition E.

A surface light emitter was obtained by performing the same operations as Example 1 except that the type of the active energy ray curable composition of the mixture is modified to the active energy ray curable composition E. Light extraction efficiency, luminance in the normal direction, and amount of change in chromaticities of the obtained surface light emitter are shown in Table 3.

The $A_{ave}/P$ value of the light extraction film for EL devices was 25.

Example 13

(Production of Active Energy Ray Curable Composition F)

60 parts of fluorenediacrylate (trade name of "EA-0200", manufactured by Osaka Gas Chemical Co., Ltd.), 10 parts of dimethacrylate represented by the chemical formula (1) (trade name of "Acryester PBOM", manufactured by Mitsubishi Rayon Co., Ltd.), 30 parts of ethoxyphenylphenol acrylate (trade name of "A-LEN-10", manufactured by Shin Nakamura Chemical Co., Ltd.), and 1.6 parts of 1-hydroxycyclohexyl phenyl ketone (trade name of "Irgacure 184", manufactured by Ciba Specialty Chemicals Corp.) were admixed with one another to obtain the active energy ray curable composition F.

A surface light emitter was obtained by performing the same operations as Example 1 except that the type of the active energy ray curable composition of the mixture is modified to the active energy ray curable composition F. Light extraction efficiency, luminance in the normal direction, and amount of change in chromaticities of the obtained surface light emitter are shown in Table 3.

The $A_{ave}/P$ value of the light extraction film for EL devices was 25.

Examples 14 and 15

A surface light emitter was obtained by performing the same operations as Example 1 except that the mixture is evenly stretched using a nip roll to have the base layer thickness shown in Table 3. Light extraction efficiency, luminance in the normal direction, and amount of change in chromaticities of the obtained surface light emitter are shown in Table 3.

The $A_{ave}/P$ value of the light extraction film for EL devices of Examples 14 and 15 was 25.

TABLE 3

| | Mixture | | | | | | Light extraction film for EL devices | | Evaluation result of surface light emitter | | |
|---|---|---|---|---|---|---|---|---|---|---|---|
| | Curable composition | | | Fine particle | | | | | | | |
| | Type | Content (%) | Refractive index of cured product | Type | Content (%) | Volume average particle diameter (μm) | Refractive index | Shape of protrusions | Thickness of base layer (μm) | EL device Type | Light extraction efficiency (%) | Luminance in normal direction (%) | Amount of change in chromaticities |
| Reference Example 1 | — | — | — | — | — | — | — | — | — | A | 100 | 100 | 0.0192 |
| Example 1 | A | 70 | 1.52 | A | 30 | 2 | 1.42 | Spherical segment | 20 | A | 177.0 | 166.0 | 0.0029 |
| Example 5 | A | 70 | 1.52 | B | 30 | 0.7 | 1.42 | Spherical segment | 20 | A | 172.0 | 181.0 | 0.0032 |
| Example 6 | A | 70 | 1.52 | C | 30 | 6 | 1.42 | Spherical segment | 20 | A | 177.3 | 166.0 | 0.0046 |
| Example 7 | A | 70 | 1.52 | D | 30 | 2 | 1.59 | Spherical segment | 20 | A | 176.9 | 165.1 | 0.0044 |
| Example 8 | A | 70 | 1.52 | E | 30 | 2 | 1.65 | Spherical segment | 20 | A | 172.4 | 173.0 | 0.0019 |
| Example 9 | B | 70 | 1.58 | A | 30 | 2 | 1.42 | Spherical segment | 20 | A | 168.9 | 172.0 | 0.0012 |
| Example 10 | C | 70 | 1.58 | A | 30 | 2 | 1.42 | Spherical segment | 20 | A | 166.1 | 168.9 | 0.0026 |
| Example 11 | D | 70 | 1.59 | A | 30 | 2 | 1.42 | Spherical segment | 20 | A | 165.3 | 169.3 | 0.0023 |
| Example 12 | E | 70 | 1.60 | A | 30 | 2 | 1.42 | Spherical segment | 20 | A | 164.2 | 169.2 | 0.0020 |
| Example 13 | F | 70 | 1.61 | A | 30 | 2 | 1.42 | Spherical segment | 20 | A | 163.3 | 170.6 | 0.0016 |
| Example 14 | A | 70 | 1.52 | A | 30 | 2 | 1.42 | Spherical segment | 5 | A | 176.8 | 165.0 | 0.0043 |
| Example 15 | A | 70 | 1.52 | A | 30 | 2 | 1.42 | Spherical segment | 30 | A | 178.4 | 168.0 | 0.0021 |

The surface light emitter having the light extraction film for EL devices of the invention, which has been obtained from Examples 1 and 5 to 15, exhibited excellent light extraction efficiency or luminance in the normal direction and is capable of sufficiently suppressing the emission angle dependence of the wavelength of emitted light.

Comparative Example 5

After weighing 106 parts of toluene, 71 parts of methyl ethyl ketone, 69 parts of methyl methacrylate, 25 parts of ethyl acrylate, 5 parts of 2-hydroxyethyl methacrylate, and 1 part of methacrylate in a 2 liter separable flask as a reaction vessel, bubbling with nitrogen was performed for 30 minutes while performing stirring using stirring wings. After that, 0.45 part of 2,2-azobis isobutyronitrile was added thereto as a polymerization initiator and the reaction vessel was heated to 90° C. and maintained in the same state for five hours. Further, after adding 1 part of 2,2-azobis isobutyronitrile and maintaining the reaction vessel for four hours, it was cooled to room temperature to complete the reaction, thus obtaining an acrylic resin (refractive index of 1.52 and mass average molecular weight of 75100) solution.

By mixing the obtained acrylic resin solution and the fine particle C, a coating liquid in which the acrylic resin solution is 20% in terms of solid matter content and the fine particle C is 80% was obtained.

On a polyethylene terephthalate base material (trade name of "Diafoil T910E125", manufactured by Mitsubishi Plastics, Inc.) with the thickness of 125 μm, the obtained coating liquid was coated by a reverse gravure coating method such that the base layer thickness has the thickness of 20 μm. After drying, a light extraction film having a convex-concave structure, which is yielded by the fine particles, was obtained.

The $A_{ave}/P$ value of the light extraction film for EL devices was 0.8.

On the light emitting side of the EL device A, Cargill standard refractive index liquid (refractive index of 1.52, manufactured by Moritex Corporation) was coated as an adhesion layer. According to optical adhesion of base material surface of the obtained light extraction film, a surface light emitter was obtained. Light extraction efficiency, luminance in the normal direction, and amount of change in chromaticities of the obtained surface light emitter are shown in Table 4.

Comparative Example 6

By mixing the acrylic resin solution obtained from Comparative Example 5 and the fine particle F, a coating liquid in which the acrylic resin solution is 50% in terms of solid matter content and the fine particle F is 50% was obtained.

On a polyethylene terephthalate base material (trade name of "Diafoil T910E125", manufactured by Mitsubishi Plastics, Inc.) with the thickness of 125 μm, the obtained coating liquid was coated by a reverse gravure coating method such that the base layer thickness has the thickness of 10 μm. After drying, a light extraction film having a convex-concave structure, which is yielded by the fine particles, was obtained.

The $A_{ave}/P$ value of the light extraction film for EL devices was 0.7.

On the light emitting side of the organic EL light emitting device A, Cargill standard refractive index liquid (refractive index of 1.52, manufactured by Moritex Corporation) was coated as an adhesion layer. According to optical adhesion of base material surface of the obtained light extraction film, a surface light emitter was obtained. Light extraction efficiency, luminance in the normal direction, and amount of change in chromaticities of the obtained surface light emitter are shown in Table 4.

TABLE 4

| | Mixture | | | | | | Light extraction film for EL devices | | | Evaluation result of surface light emitter | | |
|---|---|---|---|---|---|---|---|---|---|---|---|---|
| | Curable composition | | | Fine particle | | | | | | | | |
| | Type | Content (%) | Refractive index of cured product | Type | Content (%) | Volume average particle diameter (μm) | Refractive index | Shape of protrusions | Thickness of base layer (μm) | EL device Type | Light extraction efficiency (%) | Luminance in normal direction (%) | Amount of change in chromaticities |
| Reference Example 1 | — | — | — | — | — | — | — | — | — | A | 100 | 100 | 0.0192 |
| Example 1 | A | 70 | 1.52 | A | 30 | 2 | 1.42 | Spherical segment | 25 | A | 177.0 | 166.0 | 0.0029 |
| Comparative Example 5 | A | 20 | 1.52 | C | 80 | 2 | 1.42 | Spherical segment | <5 | A | 169.2 | 159.4 | 0.0024 |
| Comparative Example 6 | A | 50 | 1.52 | F | 50 | 2 | 1.42 | Spherical segment | <5 | A | 161.0 | 126.0 | 0.0058 |

The surface light emitter having the light extraction film for EL devices of the invention, which has been obtained from Example 1, exhibited excellent light extraction efficiency and luminance in the normal direction and is capable of sufficiently suppressing the emission angle dependence of the wavelength of emitted light.

Meanwhile, the surface light emitter having a light extraction film for EL devices which has been obtained from Comparative Examples 5 and 6, in which the ratio between the average maximum diameter $A_{ave}$ of the bottom portion of the spherical protrusions and the volume average particle diameter of the fine particle is not within the range of the mathematical equation (1) of the invention, exhibited poor luminance in the normal direction.

Examples 16 to 18 and Comparative Examples 7 to 9

A surface light emitter of Examples 16 to 18 and Comparative Examples 7 and 8 was obtained by performing the same operations as Example 1 except that the type of the EL device used is B and the composition of the mixture is modified as described in Table 5. Light extraction efficiency, luminance in the normal direction, and amount of change in chromaticities of the obtained surface light emitter are shown in Table 5.

The $A_{ave}/P$ value of the light extraction film for EL devices of Examples 16 to 18 and Comparative Example 8 was 25.

Meanwhile, since the viscosity of the mixture was high in Comparative Example 9, it was not possible to produce a light extraction film for EL devices, and therefore no surface light emitter was obtained.

TABLE 5

| | Mixture | | | | | | Light extraction film for EL devices | | | Evaluation result of surface light emitter | | |
|---|---|---|---|---|---|---|---|---|---|---|---|---|
| | Curable composition | | | Fine particle | | | | | | | | |
| | | | | | Volume | | | | | | | |
| | Type | Content (%) | Refractive index of cured product | Type | Content (%) | average particle diameter (μm) | Refractive index | Shape of protrusions | Thickness of base layer (μm) | EL device Type | Light extraction efficiency (%) | Luminance in normal direction (%) | Amount of change in chromaticities |
| Reference Example 2 | — | — | — | — | — | — | — | — | — | B | 100 | 100 | 0.015 |
| Example 16 | A | 70 | 1.52 | A | 30 | 2 | 1.42 | Spherical segment | 20 | B | 143.5 | 132.9 | 0.004 |
| Example 17 | A | 77 | 1.52 | A | 23 | 2 | 1.42 | Spherical segment | 20 | B | 147.1 | 130.7 | 0.010 |
| Example 18 | A | 60 | 1.52 | A | 40 | 2 | 1.42 | Spherical segment | 20 | B | 142.6 | 131.9 | 0.005 |
| Comparative Example 7 | A | 100 | 1.52 | — | — | — | — | Spherical segment | 20 | B | 148.7 | 111.4 | 0.025 |
| Comparative Example 8 | A | 90 | 1.52 | A | 10 | 2 | 1.42 | Spherical segment | 20 | B | 152.3 | 135.5 | 0.014 |
| Comparative Example 9 | A | 40 | 1.52 | A | 60 | 2 | 1.42 | Spherical segment | — | — | — | — | — |

The surface light emitter having the light extraction film for EL devices of the invention, which has been obtained from Examples 16 to 18, exhibited excellent light extraction efficiency and luminance in the normal direction and is capable of sufficiently suppressing the emission angle dependence of the wavelength of emitted light.

Meanwhile, the surface light emitter having a light extraction film for EL devices which has been obtained from Comparative Examples 7 and 8, in which the content of the fine particle is not within the range of the invention, was not able to suppress the emission angle dependence of the wavelength of emitted light.

Example 19

A surface light emitter was obtained by performing the same operations as Example 4 except that the type of the EL device used is B. Light extraction efficiency, luminance in the normal direction, and amount of change in chromaticities of the obtained surface light emitter are shown in Table 6.

The $A_{ave}/P$ value of the light extraction film for EL devices was 25.

Comparative Example 10

A surface light emitter was obtained by performing the same operations as Comparative Example 4 except that the type of the EL device used is B. Light extraction efficiency, luminance in the normal direction, and amount of change in chromaticities of the obtained surface light emitter are shown in Table 6.

TABLE 6

| | Mixture | | | | | | Light extraction film for EL devices | | | Evaluation result of surface light emitter | | |
|---|---|---|---|---|---|---|---|---|---|---|---|---|
| | Curable composition | | | Fine particle | | | | | | | | |
| | | | | | Volume | | | | | | | |
| | Type | Content (%) | Refractive index of cured product | Type | Content (%) | average particle diameter (μm) | Refractive index | Shape of protrusions | Thickness of base layer (μm) | EL device Type | Light extraction efficiency (%) | Luminance in normal direction (%) | Amount of change in chromaticities |
| Reference Example 2 | — | — | — | — | — | — | — | — | — | B | 100 | 100 | 0.015 |
| Example 16 | A | 70 | 1.52 | A | 30 | 2 | 1.42 | Spherical segment | 20 | B | 143.5 | 132.9 | 0.004 |
| Example 19 | A | 70 | 1.52 | A | 30 | 2 | 1.42 | Ellipsoid spherical segment | 20 | B | 145.5 | 129.4 | 0.011 |

TABLE 6-continued

| | Mixture | | | | | | Light extraction film for EL devices | | | Evaluation result of surface light emitter | | |
|---|---|---|---|---|---|---|---|---|---|---|---|---|
| | Curable composition | | | Fine particle | | | | | | | | |
| | | | | | Volume | | | | | | | |
| | Type | Content (%) | Refractive index of cured product | Type | Content (%) | average particle diameter (μm) | Refractive index | Shape of protrusions | Thickness of base layer (μm) | EL device Type | Light extraction efficiency (%) | Luminance in normal direction (%) | Amount of change in chromaticities |
| Comparative Example 10 | A | 70 | 1.52 | A | 30 | 2 | 1.42 | Quadrangular pyramid | 20 | B | 139.8 | 118.3 | 0.008 |

The surface light emitter having the light extraction film for EL devices of the invention, which has been obtained from Examples 16 and 19, exhibited excellent light extraction efficiency and luminance in the normal direction and is capable of sufficiently suppressing the emission angle dependence of the wavelength of emitted light.

Meanwhile, the surface light emitter having a light extraction film for EL devices obtained from Comparative Example 10, in which the shape of the convex-concave structure is not within the range of the invention, exhibited poor light extraction efficiency and luminance in the normal direction.

Examples 20 to 24

A surface light emitter was obtained by performing the same operations as Example 16 except that the composition of the mixture is modified as described in Table 7. Light extraction efficiency, luminance in the normal direction, and amount of change in chromaticities of the obtained surface light emitter are shown in Table 7.

The $A_{ave}/P$ value of the light extraction film for EL devices of Examples 20 to 24 was 8 to 71.

Example 25

A surface light emitter was obtained by performing the same operations as Example 16 except that the mixture is evenly stretched using a nip roll to have the base layer thickness shown in Table 7. Light extraction efficiency, luminance in the normal direction, and amount of change in chromaticities of the obtained surface light emitter are shown in Table 7.

The $A_{ave}/P$ value of the light extraction film for EL devices was 25.

TABLE 7

| | Mixture | | | | | | | Light extraction film for EL devices | | | Evaluation result of surface light emitter | | |
|---|---|---|---|---|---|---|---|---|---|---|---|---|---|
| | Curable composition | | | Fine particle | | | | | | | | | |
| | | | | | | Volume | | | | | | | |
| | Type | Content (%) | Refractive index of cured product | Type | Content (%) | average particle diameter (μm) | Refractive index | Shape of protrusions | Thickness of base layer (μm) | EL device Type | Light extraction efficiency (%) | Luminance in normal direction (%) | Amount of change in chromaticities |
| Reference Example 2 | — | — | — | — | — | — | — | — | — | B | 100 | 100 | 0.015 |
| Example 16 | A | 70 | 1.52 | A | 30 | 2 | 1.42 | Spherical segment | 20 | B | 143.5 | 132.9 | 0.004 |
| Example 20 | A | 70 | 1.52 | B | 30 | 0.7 | 1.42 | Spherical segment | 20 | B | 142.3 | 132.9 | 0.004 |
| Example 21 | A | 70 | 1.52 | C | 30 | 6 | 1.42 | Spherical segment | 20 | B | 148.6 | 133.9 | 0.012 |
| Example 22 | A | 70 | 1.52 | D | 30 | 2 | 1.59 | Spherical segment | 20 | B | 148.2 | 137.8 | 0.012 |
| Example 23 | A | 70 | 1.52 | E | 30 | 2 | 1.65 | Spherical segment | 20 | B | 142.6 | 135.1 | 0.002 |
| Example 24 | B | 70 | 1.58 | A | 30 | 2 | 1.42 | Spherical segment | 20 | B | 141.9 | 131.5 | 0.002 |
| Example 25 | A | 70 | 1.52 | A | 30 | 2 | 1.42 | Spherical segment | 30 | B | 143.8 | 131.0 | 0.005 |

The surface light emitter having the light extraction film for EL devices of the invention, which has been obtained from Examples 20 to 25, exhibited excellent light extraction efficiency and luminance in the normal direction and is capable of sufficiently suppressing emission angle dependence of the wavelength of emitted light.

INDUSTRIAL APPLICABILITY

With the light extraction film for EL devices of the invention, a surface light emitter having excellent light extraction efficiency and luminance in the normal direction and being capable of sufficiently suppressing emission angle dependence of the wavelength of emitted light can be obtained. This surface light emitter can be desirably used for luminaries, a display, a screen, or the like, for example.

EXPLANATIONS OF LETTERS OR NUMERALS

10 Light extraction film for EL devices
11 Convex-concave structure layer
12 Convex-concave structure
13 Base layer
14 Base material
15 Spherical protrusions
16 Fine particle
17 Resin
18 Bottom portion of spherical protrusions
21 Adhesion layer
22 Protection film
30 Organic EL light emitting device
31 Glass substrate
32 Positive electrode
33 Light emitting layer
34 Negative electrode
50 Production device
51 Mixture
52 Roll mold
53 Nip roll
54 Device for irradiation of active energy ray
55 Tank
56 Pipe

The invention claimed is:

1. A light extraction film for electroluminescence (EL) devices comprising: a base material; a convex-concave structure layer having a convex-concave structure and a base layer having a thickness of 3 to 50 μm interposed between the base material and the convex-concave structure, wherein:
the convex-concave structure is provided with a plurality of spherical protrusions having an average height $B_{ave}$ of 10 to 100 μm, where each of the spherical protrusions contains a resin and fine particles added into the resin;
a content of the fine particles in the spherical protrusions is 22 to 55% by mass;
a difference in refractive index between the resin and the fine particles is 0.04 to 0.20;
an average maximum diameter $A_{ave}$ of bottom portions of the spherical protrusions and a volume average particle diameter P of the fine particles satisfy the following mathematical formula:

$A_{ave}/P \geq 5$; and the spherical protrusions have an aspect ratio $B_{ave}/A_{ave}=0.3$ to 1.4.

2. The light extraction film for EL devices according to claim 1, wherein a content of the fine particles in the spherical protrusions is 24 to 50% by mass.

3. The light extraction film for EL devices according to claim 1, wherein a content of the fine particles in the spherical protrusions is 27 to 45% by mass.

4. The light extraction film for EL devices according to claim 1, wherein an arrangement of the plurality of spherical protrusions is any one of hexagonal arrangement, rectangular arrangement, and rhomboidal arrangement.

5. The light extraction film for EL devices according to claim 1, wherein a ratio of total area of bottom portions of the plurality of the spherical protrusions compared to an area of the light extraction film for EL devices is 50 to 90%.

6. The light extraction film for EL devices according to claim 1, wherein a material of the resin is an acrylic resin and the material of the fine particle is a silicone resin.

7. The light extraction film for EL devices according to claim 1, wherein the fine particles are almost evenly dispersed in the resin.

8. The light extraction film for EL devices according to claim 1, wherein, when a surface light emitter is produced by attachment on an EL device, the luminance in the normal direction of the surface light emitter after attachment is 150% or more compared to the luminance in the normal direction of the EL device before attachment.

9. A surface light emitter comprising the light extraction film for EL devices according to claim 1.

10. A method for producing the light extraction film for EL devices according to claim 1, wherein a mixture consisting of an active energy ray curable composition and fine particles is filled between an outer peripheral surface of a roll mold and a base material while rotating the roll mold with an outer peripheral surface, on which a plurality of transfer parts of the spherical protrusions with a concave shape are arranged, and running the base material in a rotational direction of the roll mold along the outer peripheral surface of the roll mold, and the active energy ray curable composition is cured all at once in a state in which the mixture is sandwiched between the outer peripheral surface of the roll mold and the base material by irradiating a region between the outer peripheral surface of the roll mold and the base material with an active energy ray.

11. The light extraction film for EL devices according to claim 1, wherein the aspect ratio $B_{ave}/A_{ave}$ of the spherical protrusions is 0.35 to 1.3.

12. The light extraction film for EL devices according to claim 1, wherein the aspect ratio $B_{ave}/A_{ave}$ of the spherical protrusions is 0.4 to 1.0.

13. The light extraction film for EL devices according to claim 1, wherein the thickness of the base layer is 5 to 45 μm.

14. The light extraction film for EL devices according to claim 1, wherein the thickness of the base layer is 10 to 40 μm.

* * * * *